(12) United States Patent
Larkin

(10) Patent No.: US 6,381,212 B1
(45) Date of Patent: Apr. 30, 2002

(54) POWER SHARING AMPLIFIER SYSTEM FOR AMPLIFYING MULTIPLE INPUT SIGNALS WITH SHARED POWER AMPLIFIERS

(75) Inventor: Robert S. Larkin, Corvallis, OR (US)

(73) Assignee: Radio Frequency Systems, Inc., Marlboro, NJ (US)

( * ) Notice: Subject to any disclaimer, the term of this patent is extended or adjusted under 35 U.S.C. 154(b) by 0 days.

(21) Appl. No.: 09/098,896

(22) Filed: Jun. 17, 1998

(51) Int. Cl.⁷ .............................. H03F 3/68; G06F 17/14
(52) U.S. Cl. ................. 370/210; 330/126; 375/297; 708/403; 455/103; 370/342
(58) Field of Search .................. 370/210, 203, 370/208, 335, 320, 321, 326, 336, 337, 342, 345, 211, 274, 275, 276, 297; 375/297; 330/126, 125, 124 D, 124 R, 149, 151; 455/103; 708/403; 333/109, 119, 125, 127, 128, 132

(56) References Cited

U.S. PATENT DOCUMENTS

| | | |
|---|---|---|
| 3,710,281 A | 1/1973 | Thomas |
| 3,731,217 A | 5/1973 | Gerst et al. |
| 3,783,385 A | 1/1974 | Dunn et al. |
| 3,957,724 A | 5/1976 | Schurb et al. |
| 3,964,065 A | 6/1976 | Roberts et al. |
| 3,997,702 A | 12/1976 | Schurb et al. |
| 4,091,387 A | 5/1978 | Profera |
| 4,163,974 A | 8/1979 | Profera |
| 4,313,988 A | 2/1982 | Koshar |
| 4,375,650 A | 3/1983 | Tiemann |
| 4,567,073 A | 1/1986 | Larson et al. |
| 4,603,408 A | 7/1986 | Singhal et al. |
| 4,614,667 A | 9/1986 | Larson et al. |

(List continued on next page.)

FOREIGN PATENT DOCUMENTS

| | | |
|---|---|---|
| EP | 0593822 | 4/1994 |
| EP | 0755129 | 1/1997 |
| EP | 0756431 | 1/1997 |
| GB | 2 230 646 A | 4/1989 |
| WO | WO 94/17766 | 8/1994 |

OTHER PUBLICATIONS

T. Ha, *Solid State Microwave Amplifier Design*, John Wiley and Sons, 1981, pp. 268–270.

(List continued on next page.)

*Primary Examiner*—William Luther
(74) *Attorney, Agent, or Firm*—Ware, Fressola, Van Der Sluys & Adolphson LLP

(57) ABSTRACT

The invention provides a power sharing amplifier system having an N by N transform matrix circuit, N amplifiers and an N by N inverse transform matrix circuit. The N by N transform matrix circuit has N input ports that respond to M input signals and provide N transform matrix input signals, where M is less than N. The N by N transform matrix circuit features at least one input port that does not receive an input signal but instead is coupled to ground. The N amplifiers respond to the transform matrix input signals and provide N amplified transform matrix input signals. The N by N inverse transform matrix circuit responds to the N amplified transform matrix input signals and provides N inverse transform matrix amplified output signals to output ports. Moreover, the N by N inverse transform matrix circuit features at least one output dissipation port that is coupled to ground to dissipate the intermodulation products contain thereon. In the power sharing amplifier system of the present invention, M and N are integers greater than 1 and 2 respectively, M is less than N, M is not equal to 6, and N is not equal to 8.

17 Claims, 15 Drawing Sheets

2 BY 3 AMPLIFIER SYSTEM

U.S. PATENT DOCUMENTS

| | | |
|---|---|---|
| 4,647,868 A | 3/1987 | Mueller |
| 4,689,631 A | 8/1987 | Gans et al. |
| 4,774,481 A | 9/1988 | Edwards et al. |
| 4,785,267 A | 11/1988 | Covill |
| 4,814,730 A | 3/1989 | Via et al. |
| 4,835,496 A | 5/1989 | Schellenberg et al. |
| 4,932,049 A | 6/1990 | Lee |
| 5,032,804 A | 7/1991 | Hollingsworth |
| 5,067,147 A | 11/1991 | Lee |
| 5,070,304 A | 12/1991 | Salib et al. |
| 5,091,875 A | 2/1992 | Wong et al. |
| 5,111,166 A | 5/1992 | Plonka et al. |
| 5,162,804 A | 11/1992 | Uyeda |
| 5,168,375 A | 12/1992 | Reisch et al. |
| 5,187,447 A | 2/1993 | Tsai |
| 5,193,109 A | 3/1993 | Lee |
| 5,202,190 A | 4/1993 | Kantner |
| 5,206,604 A | 4/1993 | Vaninetti |
| 5,214,394 A | 5/1993 | Wong |
| 5,222,246 A | 6/1993 | Wolkstein |
| 5,239,667 A | 8/1993 | Kanai |
| 5,245,347 A | 9/1993 | Bonta et al. |
| 5,290,615 A | 3/1994 | Tushaus et al. |
| 5,302,914 A | 4/1994 | Arntz et al. |
| 5,304,943 A | 4/1994 | Koontz |
| 5,313,174 A | 5/1994 | Edwards |
| 5,394,349 A | 2/1995 | Eddy |
| 5,396,516 A * | 3/1995 | Padovani et al. |
| 5,525,177 A | 6/1996 | Ross |
| 5,604,462 A | 2/1997 | Gans et al. |
| 5,604,730 A * | 2/1997 | Tiedemann, Jr. |
| 5,609,938 A | 3/1997 | Shields |
| 5,638,024 A | 6/1997 | Dent et al. |
| 5,681,660 A | 10/1997 | Bull et al. |
| 5,742,584 A | 4/1998 | Meredith |
| 5,764,104 A | 6/1998 | Luz |
| 5,790,517 A | 8/1998 | Meredith |
| 5,830,529 A | 11/1998 | Russ |
| 6,041,081 A * | 3/2000 | O et al. |
| 6,075,411 A * | 6/2000 | Briffa et al. |

OTHER PUBLICATIONS

Pappenfus et al., "Single Sideband Principles and Circuits", McGraw–Hill Book Company, Copyright© 1964, Library of Congress Card No. 63–13938, 789–MAMM–754321, 48455, SSB Generation, pp 33–41.

Larkin, R.S., "Multiple–Signal Intermodulation and Stability Considerations in the Use of Linear Repeaters", IEEE Vehicular Technology Conference, 1991.

Brigham, E.O., "The Discrete Fourier Transform", Prentice Hall 1974, pp. 91–99.

Norgaard, D.E., "The Phase–Shift Method of Single–Sideband Signal Generation", Proc. IRE, pp. 1718–1735, Dec. 1956.

* cited by examiner

| IN | OUT |
|----|-----|
| 1 | 6 |
| 2 | 5 |
| 3 | 8 |
| 4 | 7 |
| 5 | 2 |
| 6 | 1 |
| 7 | 4 |
| 8 | 3 |

MAPPING OF SIGNAL PATHS FROM INPUT TO OUTPUT FOR THE 8 BY 8 CELLULAR CONFIGURATION.

FIG. 1D

|   | A | B | C | D | E | F | G | H |
|---|---|---|---|---|---|---|---|---|
| 1 | 0 | 3 | 3 | 2 | 2 | 1 | 3 | 2 |
| 2 | 0 | 3 | 3 | 2 | 0 | 3 | 1 | 0 |
| 3 | 0 | 3 | 1 | 0 | 0 | 3 | 3 | 2 |
| 4 | 0 | 3 | 1 | 0 | 2 | 1 | 1 | 0 |
| 5 | 0 | 1 | 1 | 2 | 0 | 1 | 3 | 0 |
| 6 | 0 | 1 | 1 | 2 | 2 | 3 | 1 | 2 |
| 7 | 0 | 1 | 3 | 0 | 2 | 3 | 3 | 0 |
| 8 | 0 | 1 | 3 | 0 | 0 | 1 | 1 | 2 |

FIG. 1E

PHASE SHIFTS, IN MULTIPLES OF 90° BETWEEN PORTS 1 TO 8 AND PORTS A TO H FOR AN 8TH ORDER TRANSFORM MATRIX.

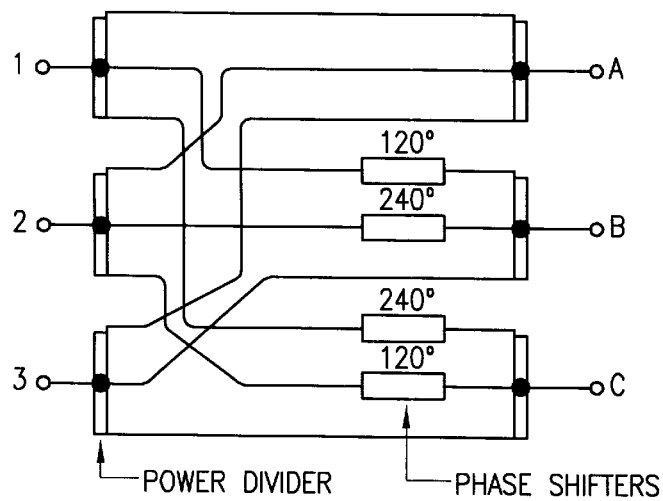
NUMBER OF REQUIRED
120° PHASE SHIFTS
FIG. 2C
FIG. 2B
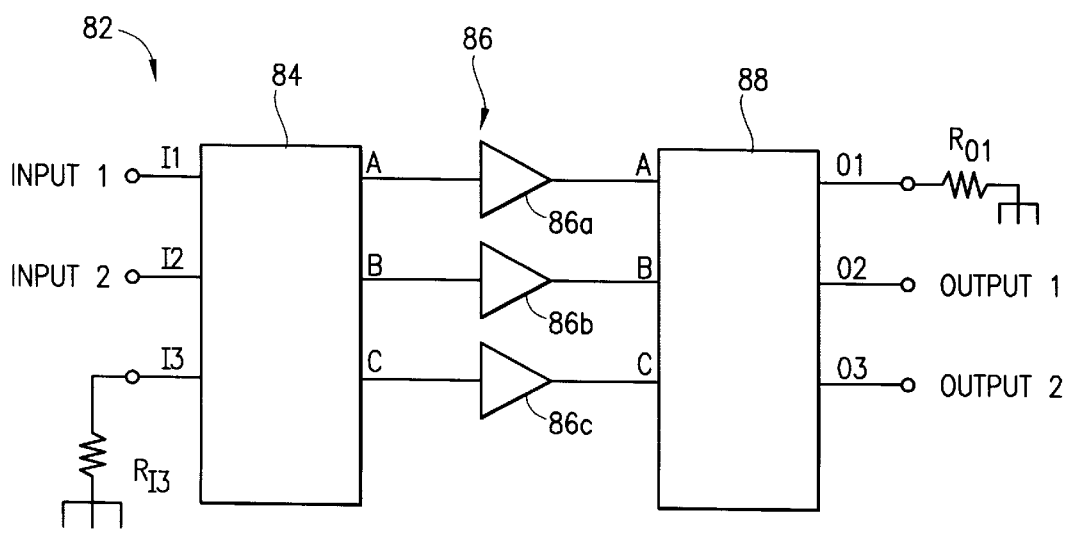
2 BY 3 AMPLIFIER SYSTEM
FIG. 2A

OUTPUT MAP FOR 3 INPUTS AND 4 AMPLIFIERS
THIRD ORDER INTERMODULATION

|        | OUTPUT PORT |     |     |     |
|--------|-----|-----|-----|-----|
|        | 1   | 2   | 3   | 4   |
| 17 Hz  | −49 |     |     |     |
| 19 Hz  |     | −43 |     | −49 |
| 21 Hz  | −49 |     | 1   |     |
| 23 Hz  |     | −43 |     | 1   |
| 25 Hz  | 1   |     | −49 |     |
| 27 Hz  |     | −43 |     | −49 |
| 29 Hz  |     |     | −49 |     |

MAP SHOWING AVERAGE POWER, dBW, AT OUTPUT OF 4 PORTS WITH 3 INPUTS. OUT-OF-BAND SIGNALS AND DESIRED SIGNALS (1 dBW) ARE SHOWN IN BOLD FACE. ALL IM PRODUCTS ARE SINGLE. INPUTS ARE PORT 1=21 Hz, PORT 2=23 Hz AND PORT 3=25 Hz. BLANK AREAS ARE LOW POWER, LIMITED BY NETWORK BALANCE. POWERS ARE CALCULATED FOR 1 dBW INPUT AND IP3=+20dBW. THE −49 dBW LEVEL CORRESPONDS TO THE TWO SIGNAL IM3 FROM A IP3=+26 AMPLIFIER.

FIG. 7

OUTPUT MAP FOR 6 INPUTS AND 8 AMPLIFIERS

| Freq | 1 | 2 | 3 | 4 | 5 | 6 | 7 | 8 |
|---|---|---|---|---|---|---|---|---|
| 11 Hz | −61.6 | | | | | | | |
| 13 Hz | | −54.8 | | | | | | |
| 15 Hz | −54.8 | | −55.6 | | | −61.6 | | |
| 17 Hz | | −61.6 | | −52.2 | | | | −54.8 |
| 19 Hz | −61.6 | | −52.2 | | −52.2 | | −54.8 | |
| 21 Hz | | −54.8 | | −55.6 | | −9.3 | | −61.6 |
| 23 Hz | −54.8 | | −55.6 | | −9.3 | | −52.2 | |
| 25 Hz | | −61.6 | | −52.2 | | −52.2 | | −9.3 |
| 27 Hz | −52.2 | | −52.2 | | −61.6 | | −9.3 | |
| 29 Hz | | −9.3 | | −55.6 | | −54.8 | | −52.2 |
| 31 Hz | −9.3 | | −55.6 | | −54.8 | | −61.6 | |
| 33 Hz | | −52.2 | | −52.2 | | −61.6 | | −54.8 |
| 35 Hz | | | −52.2 | | −61.6 | | −54.8 | |
| 37 Hz | | | | −55.6 | | −54.8 | | −61.6 |
| 39 Hz | | | | | −54.8 | | | |
| 41 Hz | | | | | | −61.6 | | |

MAP SHOWING AVERAGE POWER AT OUTPUT OF 8 PORTS WITH 6 INPUTS. OUT-OF-BAND SIGNALS AND DESIRED SIGNALS (−9.3) ARE SHOWN IN BOLD FACE. −54.8 AND −52.2 LEVELS ARE FROM MULTIPLE IM PRODUCTS ADDED TOGETHER. OTHERS ARE SINGLE. INPUTS ARE PORT 1=21 Hz, PORT 2=23 Hz, ETC. BLANK AREAS ARE LOW POWER, LIMITED BY NETWORK BALANCE.

FIG. 9

AN M BY N BY P
LOAD SHARING
AMPLIFIER SYSTEM

POWER SHARING AMPLIFIER SYSTEM FOR AMPLIFYING MULTIPLE INPUT SIGNALS WITH SHARED POWER AMPLIFIERS

BACKGROUND OF THE INVENTION

1. Field of the Invention

The present invention relates generally to amplifiers; and more particularly, to a power sharing amplifier system for land based mobile radio systems.

2. Description of the Prior Art

T. Ha, *Solid State Microwave Amplifier Design*, John Wiley and Sons, 1981, pages 268–269, shows and describes a 1 by 2 balanced amplifier in Figure 6.33 thereof for amplifying a single signal. Moreover, in the prior art, 1 by N balanced amplifiers are known for amplifying a single signal, where N is greater than 2. For example, known 1 by N balanced amplifiers have a transform matrix, N shared amplifiers, and an inverse transform matrix. The transform matrix has N input ports, wherein one input port receives the signal or signals to be amplified, and all remaining input ports are connected to ground through terminating resistors and the inverse transform matrix combines the signal or signals to a single output port with the remaining output ports connected to ground through terminating resistors. In the prior art, if two or more signals are to be amplified, then a corresponding two or more 1 by N balanced amplifiers are needed and used. In this prior art, multiple input/output signal paths are not used. One disadvantage of this approach is that a separate 1 by N balanced amplifier, and separate N shared amplifiers, are needed and used for each input/output signal path which significantly increases the cost of amplifying multiple signals.

In addition, FIG. 1A shows a known cellular configuration for three cellular sectors in a land mobile radio system generally indicated as 20 with three separate low power transmitters 22, 24, 26; three separate amplifiers 28, 30, 32; and three separate antennas 34, 36 and 38. One major disadvantage of the standard cellular configuration 20 is that if an amplifier fails then a whole sector loses communication with any mobile subscriber in the sector until the amplifier is repaired or replaced. In view of this, the standard cellular configuration 20 will typically include a respective extra amplifier (not shown) for each of the three separate antennas 34, 36 and 38. Thus six amplifiers must be used. Since amplifiers are expensive, this approach increases the cost of the standard cellular configuration 20.

FIG. 1B shows a 4 by 4 cellular configuration generally indicated as 40 similar to that shown and described in U.S. patent application Ser. No. 08/683,735, which is hereby incorporated in its entirety by reference. The U.S. patent application Ser. No. 08/683,735 is commonly owned by the assignee of the present application. The 4 by 4 cellular configuration 40 has four separate low power transmitters 42, 44, 46, 48; a 4th order transform matrix circuit 50, four power sharing amplifiers 52, 54, 56, 58; a 4th order inverse transform matrix circuit 60; and four antennas generally indicated as 62, 64, 66, 68. The 4th order transform matrix circuit 50 has four input ports 50a, 50b, 50c, 50d that respond to four different input signals from the four separate low power transmitters 42, 44, 46, 48, and provides four transform matrix input signals. The four separate amplifiers 52, 54, 56, 58 respond to the four transform matrix input signals and provide four shared linear power amplified transform matrix signals. The 4th order inverse transform matrix circuit 60 responds to the four shared linear power amplified transformed signals and provides four inverse transform matrix amplified output signals to output ports 60a, 60b, 60c, 60d. In effect, the 4 by 4 cellular configuration 40 is characterized by having equal amplitude levels at all amplifiers from any input since a phase shift portion of each signal is presented to each amplifier 52, 54, 56, 58. In the amplification sharing technique used in the 4 by 4 cellular configurations 40, each amplifier 52, 54, 56, 58 shares in a substantially equal manner to the amplification of each input signal. Because of this, each shared amplifier 52, 54, 56, 58 may be four times less powerful than the amplifiers used in the standard cellular configuration shown in FIG. 1A.

FIG. 1C shows an 8 by 8 cellular configuration generally indicated as 70 similar to that shown and described in U.S. patent application Ser. No. 08/683,735. The 8 by 8 cellular configuration 70 includes eight separate low power transmitters generally indicated 72, an 8th order transform matrix circuit 74, eight amplifiers generally indicated 76, an 8 by 8 inverse transform matrix circuit 78, and eight antennas generally indicated as 80. FIG. 1D shows a mapping of each input port to a respective output port in the 8th order cellular configuration. FIG. 1E shows a chart of phase shifts for the 8th order transform matrix circuit 74 and the 8th order inverse transform matrix circuit 78 in the 8 by 8 cellular configuration.

The reader is generally referred to U.S. patent application Ser. No. 08/683,735 for a more detailed description of the 4 by 4 and 8 by 8 cellular configurations 40, 70.

The amplification sharing technique used in the 4 by 4 and 8 by 8 cellular configurations 40 and 70 offers some important advantages over the amplification technique of the standard cellular configuration 20. For example, in the 4 by 4 cellular configuration 40, the four separate amplifiers 52, 54, 56, 58 effectively share the amplification of all the input signals, which provide inherent redundancy in the overall amplification of the input signals. Thus, if one amplifier fails, then all sectors still operate and maintain communication between the subscriber and the land mobile radio system. In such a case, the 4 by 4 cellular configurations 40 may be operating in a less desirable operating mode, but nevertheless it still operates and allows additional time for the failed amplifier to be repaired or replaced. Moreover, the 4 by 4 cellular configuration 40 also uses fewer amplifiers than the standard cellular configuration 20 if redundant amplifiers are maintained for each sector. These advantages combine to make the improved cellular configuration 40 less expensive and more reliable than the standard cellular configuration 20.

However, one disadvantage of the 4 by 4 and the 8 by 8 cellular configuration 40, 70 shown in FIGS. 1B and 1C is that the amplification sharing technique results in intermodulation products between the multiple input signals to the various amplifiers that distort the amplified RF output signal sent to and transmitted by the antennas 62, 64, 66, 68, 80. The present invention provides a new and unique way to minimize the undesirable effects of the intermodulation products in the 4 by 4 and the 8 by 8 cellular configuration 40, 70, as well as other power sharing amplification systems.

SUMMARY OF THE INVENTION

In its broadest sense, the present invention provides a power sharing amplification system having an N by N transform matrix circuit, N power sharing amplifiers and an N by N inverse transform matrix circuit. The N by N transform matrix circuit has N input ports and responds to M input signals for providing N transform matrix input signals, where M is less than N. The N by N transform matrix circuit has at least one input port that does not receive an input signal. The N power sharing amplifiers respond to the N transform matrix input signals, for providing N amplified transformed signals. The N by N inverse transform matrix circuit responds to the N amplified transformed signals, for providing M inverse transform amplified output signals to N more output ports. The N by N inverse transform matrix circuit has at least one output port that does not provide an output signal to an antenna but instead provide an output for dissipation of intermodulation products. In the power sharing amplifier system of the present invention, M and N are integers greater than 1 and 2 respectively, M is less than N, M is not equal to 6, and N is not equal to 8. (A power sharing amplifier system having M equals 6 and N equals 8 for a cellular communications system is shown, described and claimed in a co-pending patent application filed concurrently with the present application and owned by the assignee of the present instant application.)

In one embodiment, the at least one input port of the N by N transform matrix circuit that does not receive an input signal is coupled to ground via a matching resistor; and the at least one output dissipation port of the N by N inverse transform matrix circuit is coupled to ground via a corresponding matching resistor to dissipate the intermodulation products.

Various embodiments are shown and described below, including a system composed of a 3rd order transform matrix with two signal inputs, three shared amplifiers and a 3rd order inverse transform matrix with two output signals referred to as a 2 by 3 amplifier system, and a 3 by 4 power sharing amplifier system (three signals and four amplifiers).

Embodiments are also described for other m by n amplifier systems including an m by 5 amplifier system, an m by 8 amplifier system, and a 6 by 8 power amplifier system (six signals and eight amplifiers) which is claimed in another related patent application.

In general, the power sharing amplifiers are configured with suitable networks at the input and output such that specific intermodulation products are "steered" to specific output ports and much of the intermodulation power is dissipated in a resistive termination at the unused output port or ports.

One important feature of the claimed invention is that multiple signals are amplified with a single M by N power sharing amplifier system using the same N shared amplifiers. For example, if two or more signals are to be amplified, then the single M by N power sharing amplifier system provides the amplification for all two or more signals. One important advantage of this approach is that the use of the single M by N power sharing amplifier system to amplify multiple signals significantly decreases the cost of amplifying multiple signals, especially in the case of cellular phone applications.

Other objects of the invention will in part be apparent and will in part appear hereinafter.

Accordingly, the invention comprises the features of construction, combination of elements, and arrangement of parts which will be exemplified in the construction hereinafter set forth, and the scope of the invention will be indicated in the claims.

BRIEF DESCRIPTION OF THE DRAWING

For a fuller understanding of the nature of the invention, reference should be made to the following detailed descriptions taken in connection with the accompanying drawing, including FIGS. 1–13B, which are not drawn to scale:

FIG. 1D is a mapping of each input port to a respective output port for the 8 by 8 cellular configuration shown in FIG. 1C.

FIG. 1E is a chart of phase shifts from input ports 1–8 to output ports A–H for an 8th order transform matrix or an 8th order inverse transform matrix for the 8 by 8 improved cellular configuration shown in FIG. 1C.

FIG. 2A is a block diagram of a 2 by 3 power sharing amplifier system which is the subject matter of the present invention.

FIG. 2B is a schematic diagram of a 3rd order transformation network.

FIG. 2C is a table of a number of required 120 degrees phase shifts for the 3rd order Transformation Matrix network shown in FIG. 2B.

FIG. 7 is a table of an output map of signals and third order intermodulation products for the 4-way transform matrix shown in FIG. 4A using the amplifier system of FIG. 3 consisting of three input ports, the 4-way transform matrix of FIG. 4A, four amplifiers, the three output ports, and an output dissipation port coupled to ground for dissipating the intermodulation products.

FIG. 9 is an output map for the 6 by 8 cellular configuration shown in FIG. 8.

BEST MODE FOR CARRYING OUT THE INVENTION 2 by 3 Power Sharing Amplifier System in FIGS. 2A–C FIG. 2A shows a power sharing amplifier system generally indicated as 82 having a 3rd order transform matrix network 84, amplifiers generally indicated as 86 and an inverse 3rd order transform matrix network 88, which together are the subject matter of the present invention.

Figure 1A:
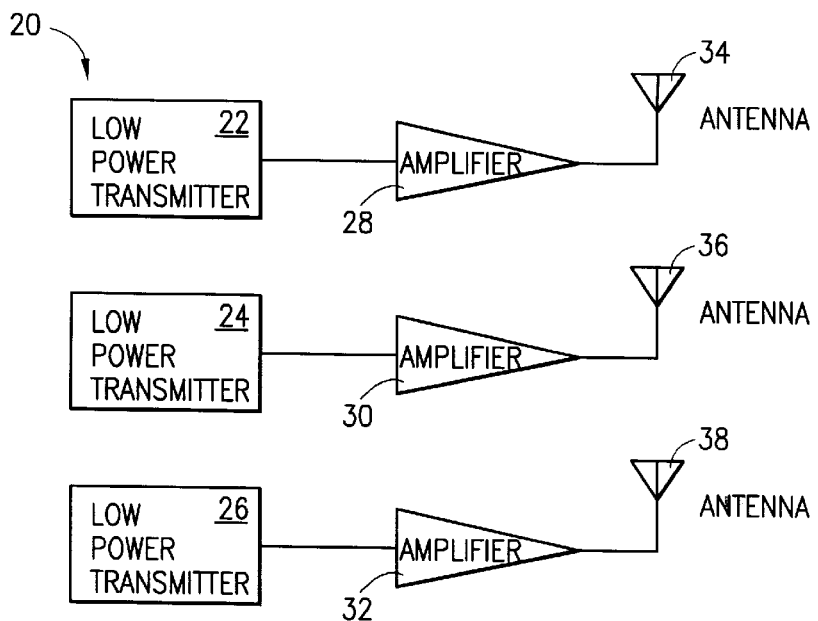
FIG. 1A is a block diagram of a standard cellular configuration having three sectors where each transmitter produces multiple signals that are respectively amplified by independent linear amplifiers.
Figure 1B:
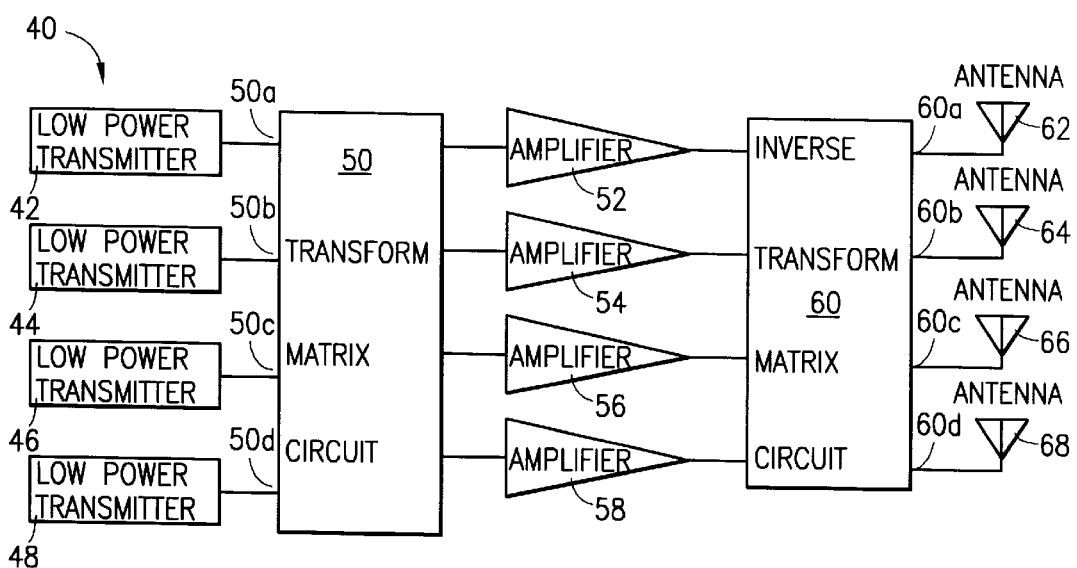
FIGS. 1B and 1C are block diagrams of 4 by 4 and 8 by 8 cellular configurations similar to that shown and described in U.S. patent application Ser. No. 08/683,735.
Figure 1C:
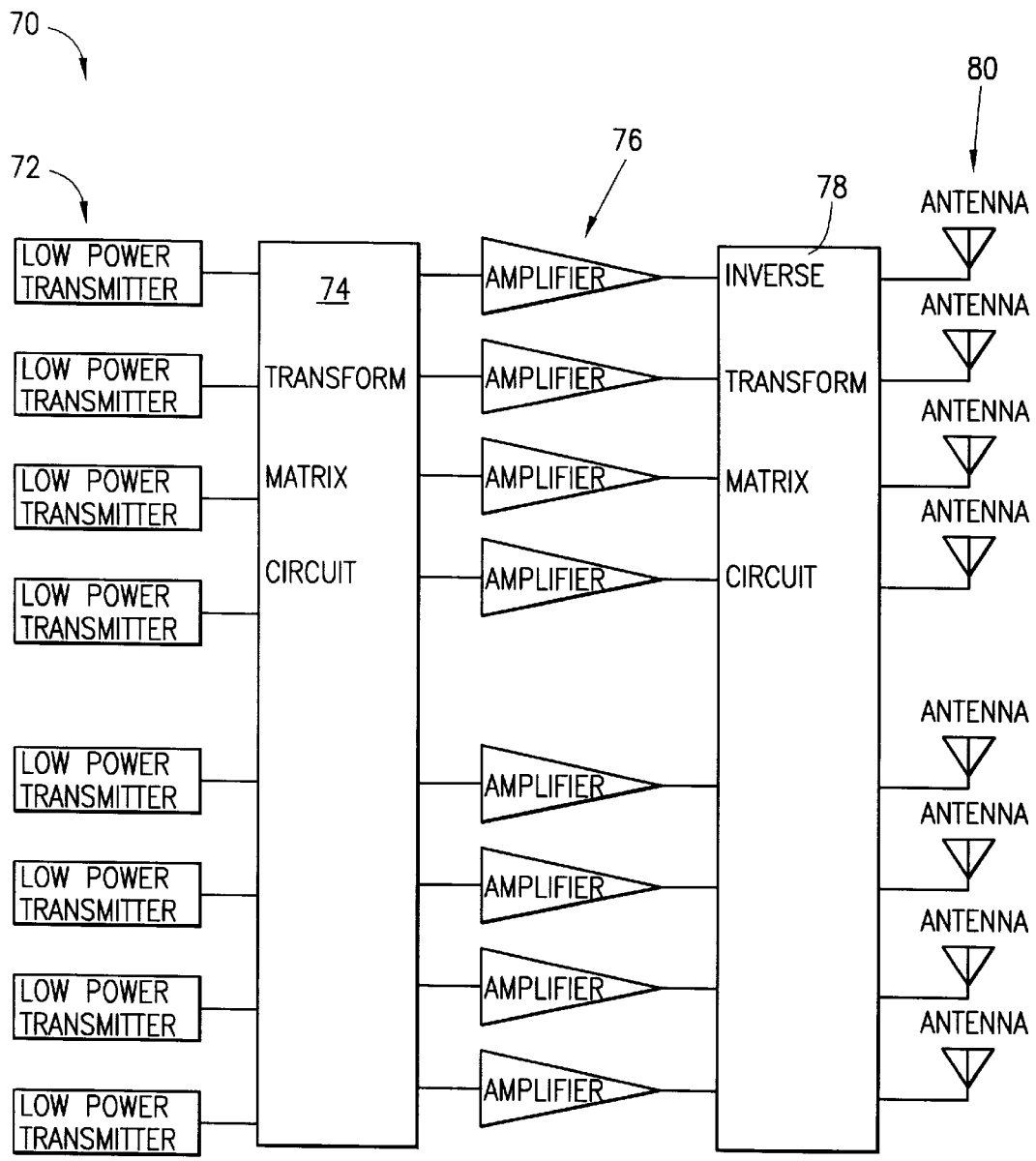

The transform matrix network 84 has input ports labelled I1 and I2 and responds to input signals for providing transformed input signals to output ports A, B, C. The transform matrix circuit 84 has at least one input port I3 that does not receive an input signal. The transform matrix network 84 is known in the art and shown in greater detail in the schematic diagram in FIG. 2B.

The amplifiers 86 respond to the transformed input signals from output ports A, B, C of the transform matrix network 84, for providing amplified transformed signals. As shown, the amplifiers 86 include three amplifiers 86a, 86b, 86c. The amplifiers 86a, 86b, 86c are known in the art.

The inverse transform matrix network 88 has input ports A, B, C that respond to the amplified transformed signals from the amplifiers 86a, 86b, 86c, for providing inversely transformed amplified output signals from output ports O2, O3. The inverse transform matrix network 88 has one output dissipation port O1 that does not provide an output signal to an antenna but instead provide an output for dissipation of intermodulation products. The inverse transform matrix network 88 is known in the art and would be an inverse transform matrix to that shown in FIG. 2B.

As shown, the transform matrix network 84 has one input port I3 that does not receive an input signal, which may be coupled to ground via a matching resistor $R_{I3}$. The one output dissipation port O1 may be coupled to ground via a corresponding matching resistor $R_{O1}$ to dissipate the intermodulation products.

As shown, the network shown in FIG. 2B is one element used to construct the 2 by 3 power sharing amplifier system shown in FIG. 2A. The 2 by 3 power sharing amplifier system has two input signals, three shared amplifiers, and two output signals. As shown in the chart in FIG. 2C, the phase multiples are 120 degrees. This network is a physical implementation of an N=3 discrete Fourier transform, which is discussed in more detail below. This network was analyzed in a Matlab computer simulation program and found to produce outputs as follows:

Input 1→Output 2
Input 2→Output 3
3rd IM→Output 1.

That is, all of the 3rd order intermodulation (two products) go to the terminated port, leaving the amplified signals with no degradation due to having the multiple signals present in the amplifiers.

One important advantage of the 2 by 3 power sharing amplifier system is that all of the undesirable intermodulation products are directed to and dissipated by the output dissipation port O1 of the inverse transform matrix network 88. Because of this, the 2 by 3 power sharing amplifier system 82 of the present invention achieves higher reliability and reduced intermodulation distortion.

If each signal being amplified by an 2×3 power sharing amplifier system is of a constant envelope, there are benefits in terms of load sharing and reliability. (Note that, in general, where term "signal" is used herein, one could also describe the invention is terms of complex waveforms, such as AM, FM, digital signals like Time Division Multiple Access (TDMA) and Code Division Multiple Access (CDMA) signals, or the sum of two or more of these signals.) The benefits to signals of non-constant envelope at each amplifier are even greater. A 2 by 3 power sharing amplifier system 82 shown in FIG. 2A was considered with a signal applied to one of the inputs consisting of the sum of two sine waves. This is representative of general non-constant envelope signals. In operation, the 2 by 3 power sharing amplifier system 82 system generated intermodulation distortions due to the double sine wave. The input level at each amplifier 86a, 86b, 86c was determined to be down 10*log(3)=4.77 dB relative to the signal levels at the input to the transform matrix. Conventional power series intermodulation analysis shows that the 3rd order intermodulation will drop by 2*4.77=9.54 dB. If each of these signals had been placed through a single amplifier that was 3/2 times the power capability of each of the amplifiers 86a, 86b, 86c in the 2 by 3 power sharing amplifier system (i.e., the same total amplifier power capability), then the signal level at each amplifier would be 4.77 dB higher. But the intercept point would be only 10*log(1.5)=1.76 dB greater and the intermodulation would be 2*(4.77−1.76)=6.0 dB higher. Thus, the intermodulation associated with just the signal going to ports 1 or port 2 benefits substantially by using the 2 by 3 power sharing amplifier system 82 as a multiple linear amplifier. This improvement is very real and significant contribution to the state of the art, when one considers that this occurs concurrently with a second signal in the other input. All of this happens with no third-order intermodulation between the two input signals.

It has been found that there are limits to this improvement. For example, signals need to be low enough so that there is adequate power capability available, or compression effects will dominate. Additionally, the 3 by 3 transform matrix networks will have phase and amplitude imperfections that will limit the cancellation of intermodulation products.

The scope of the invention is not intended to be limited to only 2 by 3 power sharing amplifiers. For example, the improvement described above may be applied to any M and N, although possibly not achieving the exact same advantages seen when using the 2 by 3 power sharing amplifier system.

It is important to point out that the signal analysis described herein assumes that the ensemble of signals is narrowband in the sense that they occupy less than an octave. While examining signal intermodulation products such as $2f_1+f_2$, the signal analysis has ignored the effect of products of frequency $2f_1+f_2$ which could be in the band of concern if more than an octave is occupied. In addition, 120 degree phase shifters and the like are simple to build on a narrowband basis but not for an octave. This assumption is quite valid for most communication systems, typically occupying a 30 MHz band at 900 MHz.

Figure 3:
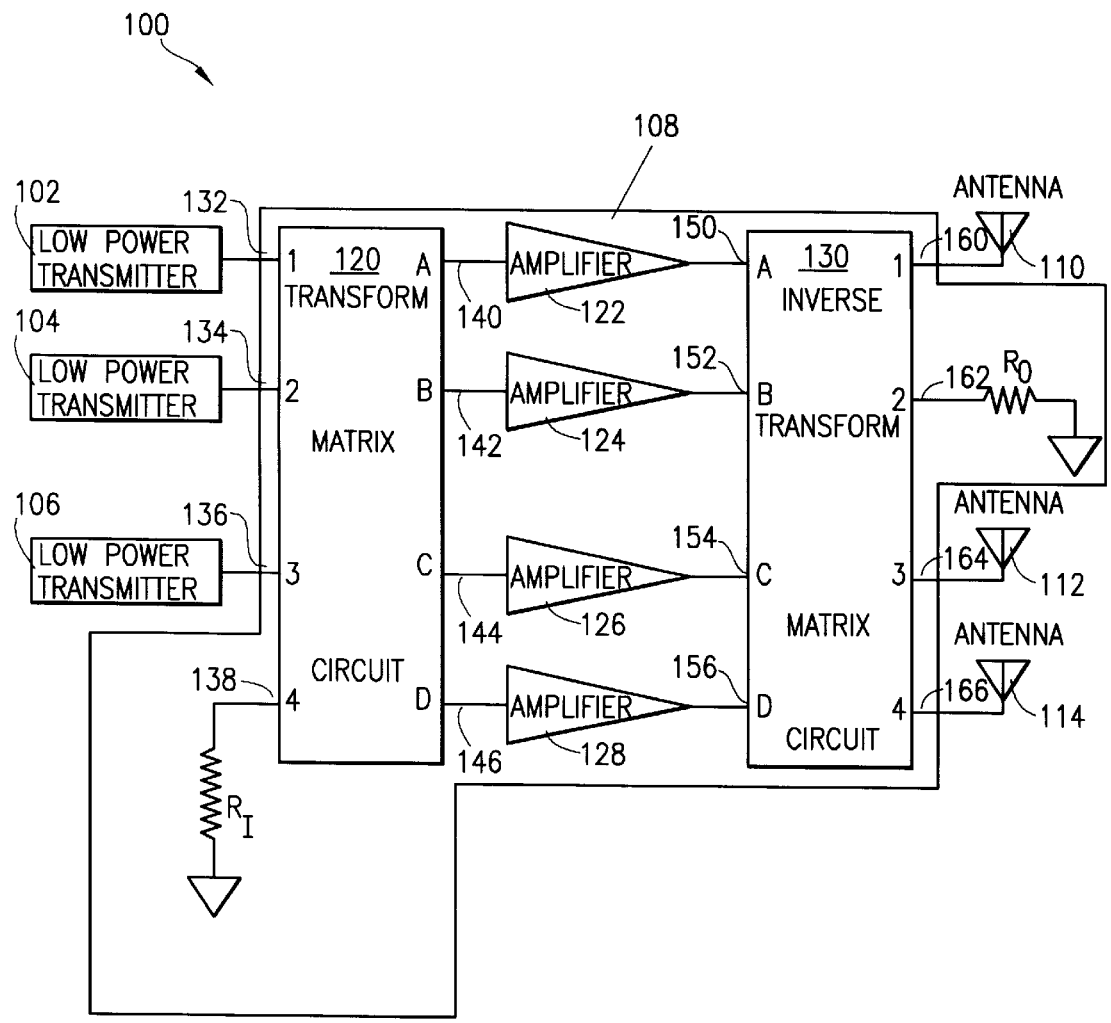
FIG. 3 is a block diagram of a 3 by 4 cellular configuration that is one embodiment of the present invention.

3 by 4 Cellular Configuration in FIG. 3

FIG. 3 shows another embodiment of the invention that is a 3 by 4 cellular configuration of the present invention generally indicated as 100.

As shown, the cellular configuration 100 includes three low power transmitter 102, 104, 106, a power sharing amplifier system generally indicated 108, and three antennas 110, 112, 114.

The low power transmitters 102, 104, 106 provides three RF input signals to the power sharing amplifier system 108. The low power transmitters 102, 104, 106 are well known in the art; and the scope of the invention is not intended to be limited to any particular type of low power transmitter.

The power sharing amplifier system 108 includes a 4-way transform matrix circuit 120, four amplifiers 122, 124, 126, 128 and an inverse 4-way transform matrix circuit 130. The transform and inverse transform matrices 120, 130 are also known as a four amplifier combining network.

The transform matrix circuit 120 has three input ports 132, 134, 136 that respectively respond to three RF input signals from the low power transmitters 102, 104, 106, and provides four transformed RF input signals from four output ports 140, 142, 144, 146. As shown, in the power sharing amplifier system 108 of the present invention the transform matrix circuit 120 has an input port 138 that does not receive an RF input signal from a low power transmitter but instead is coupled to ground via a resistor Ri.

The four amplifiers 122, 124, 126, 128 respond to the transformed RF input signals from output ports 140, 142, 144, 146 of the transform matrix circuit 120 and provide four amplified transformed RF input signals to input ports 150, 152, 154, 156 of the inverse transform matrix circuit 130. The reader is generally referred to U.S. patent application Ser. No. 08/683,735, where the four amplifiers 122, 124, 126, 128 are shown and described in more detail as shared linear power amplifiers. Embodiments are envisioned using other types of amplifiers; and the scope of the invention is not intended to be limited to any particular type of amplifier.

The inverse transform matrix circuit 130 responds to the four amplified transformed RF input signals received by the input ports outputs 150, 152, 154, 156, and provides three inversely transformed amplified RF output signals to three output ports 160, 164, 166. As shown, in the power sharing amplifier system 108 of the present invention the inverse transform matrix circuit 130 features an output dissipation port 162 that does not provide an inversely transformed amplified RF output signal, but instead is coupled to ground via a resistor Ro to dissipate the intermodulation products.

The reader is generally referred to U.S. patent application Ser. No. 08/683,735, where the transform matrix circuit 120 is shown and described in more detail as an N by N Fourier transform matrix circuit, and where the inverse transform matrix circuit 130 is shown and described in more detail as an N by N inverse Fourier transform matrix circuit. FIG. 3 shows the case where N=4. Embodiments are envisioned using other types of transform or inverse transform matrices; and the scope of the invention is not intended to be necessarily limited to any particular type of transform or inverse matrix.

A Computer Modelling for the 3×4 Cellular System in FIG. 3

In the 3 by 4 power sharing amplifier system there are enough output port/frequency combinations to never have more than one product at a single place on the output map. More importantly, the three bigger three-signal IM products that exist with three inputs all are steered to the single output port that need not be used and, therefore, these signals are never radiated.

Figure 4:
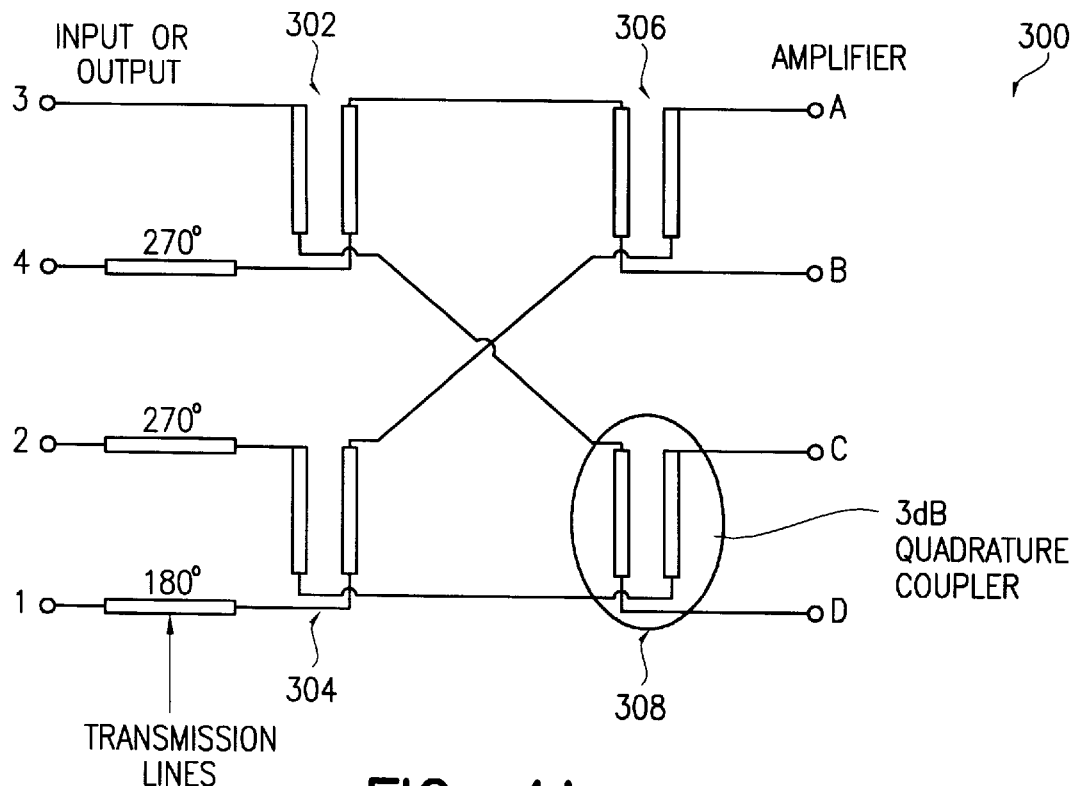
FIG. 4A is a diagram of a 4th order transformation matrix.
FIG. 4B is a table of inputs versus outputs for the 4 by 4 cellular configuration of FIG. 1B.
FIG. 4C is a table of the number of 90 degree phase shifts as a function of inputs/outputs versus amplifiers for the 4th order transformation matrix shown in FIG. 4A.

FIG. 4A shows a 4th order transformation network generally indicated as 300 for use in a 3 by 4 power sharing amplifier system that was studied along with one possible implementation. In FIG. 4A, the 4th order transformation network 300 would produce equal amplitudes at all amplifiers along with multiples of 90 degree phase shift, as discussed above, by use of four 3 dB quadrature couplers generally indicated as 302, 304, 306, 308.

Figure 5:
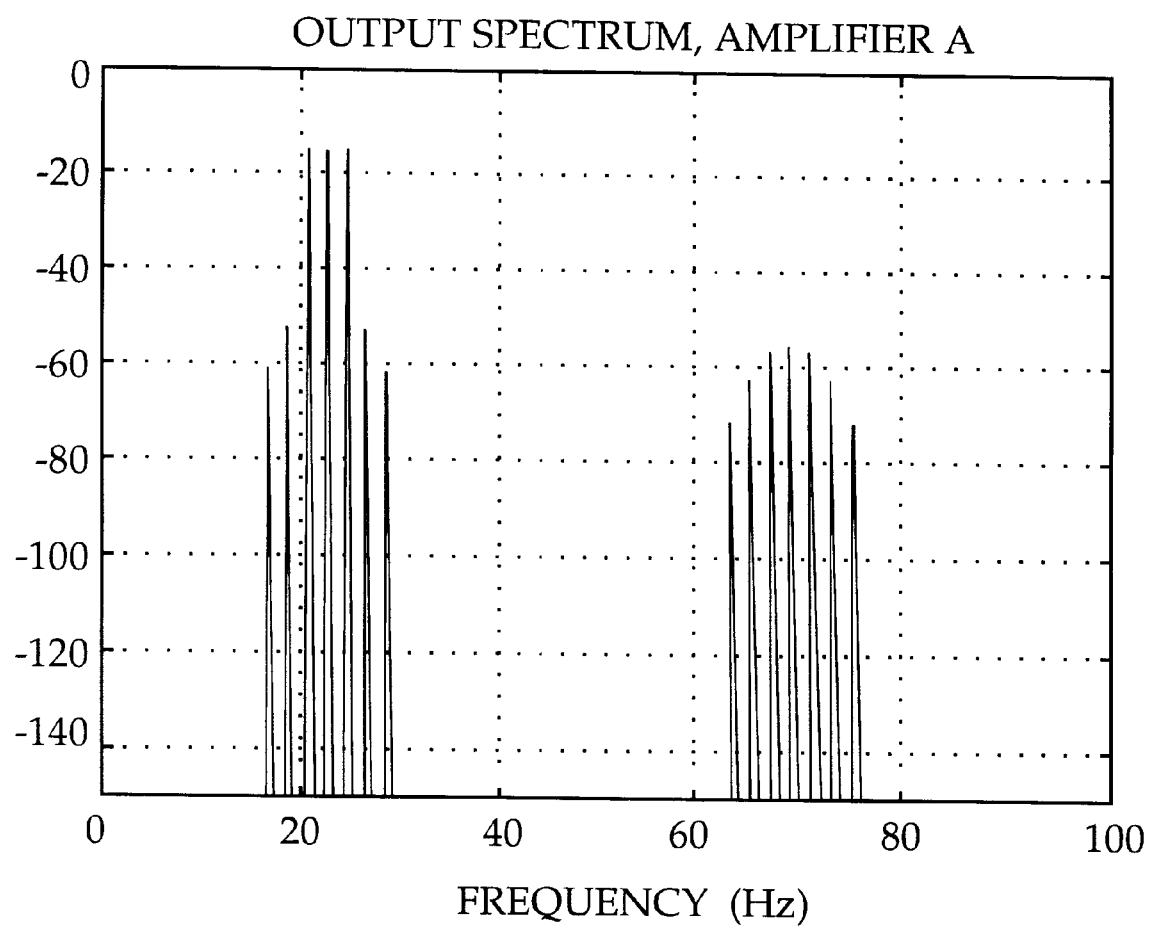
FIG. 5 is a graph of a simulation of an output spectrum for one port of four amplifiers, for the 3 by 4 amplifier system shown in FIG. 3.
Figure 6A:
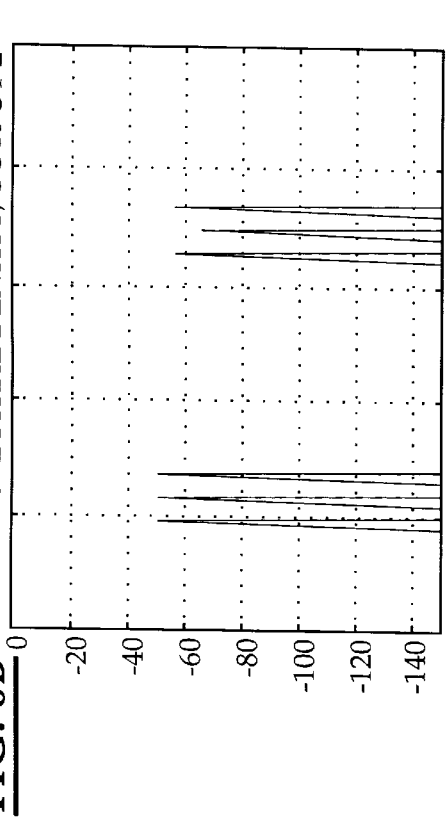
FIGS. 6A–6D are respective graphs of a simulation of power spectral density for outputs 1–4 of the 3 by 4 amplifier system shown in FIG. 3 measured in frequency along the X axis versus output power measured in decibel along the Y axis.
Figure 6B:
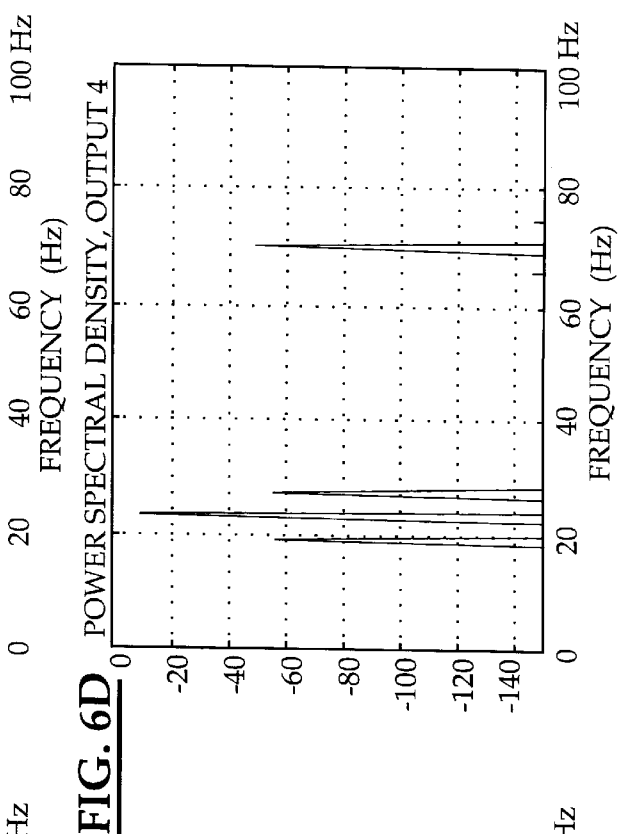
Figure 6C:
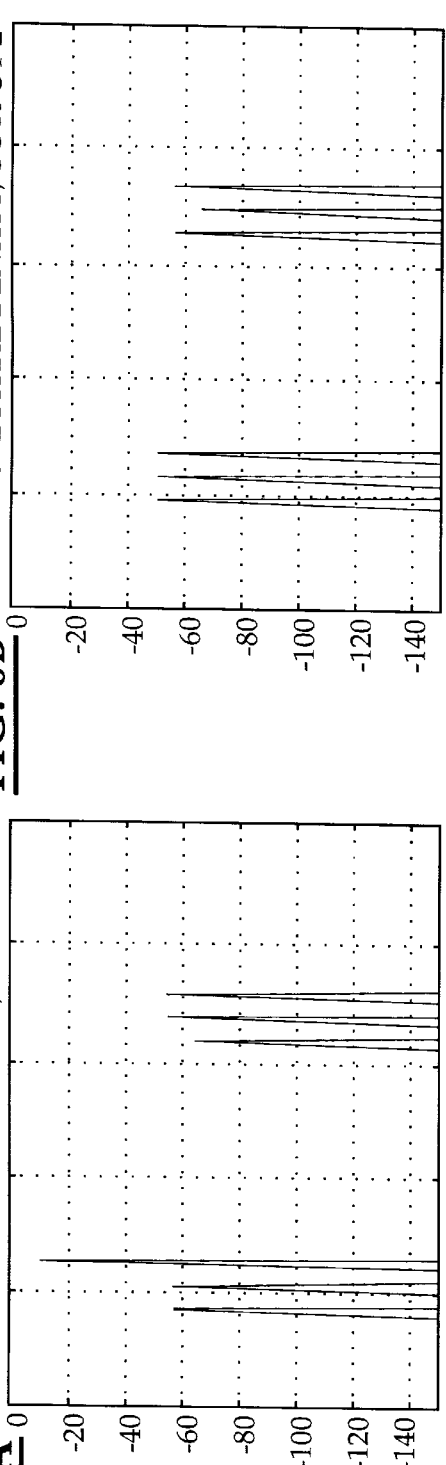
Figure 6D:
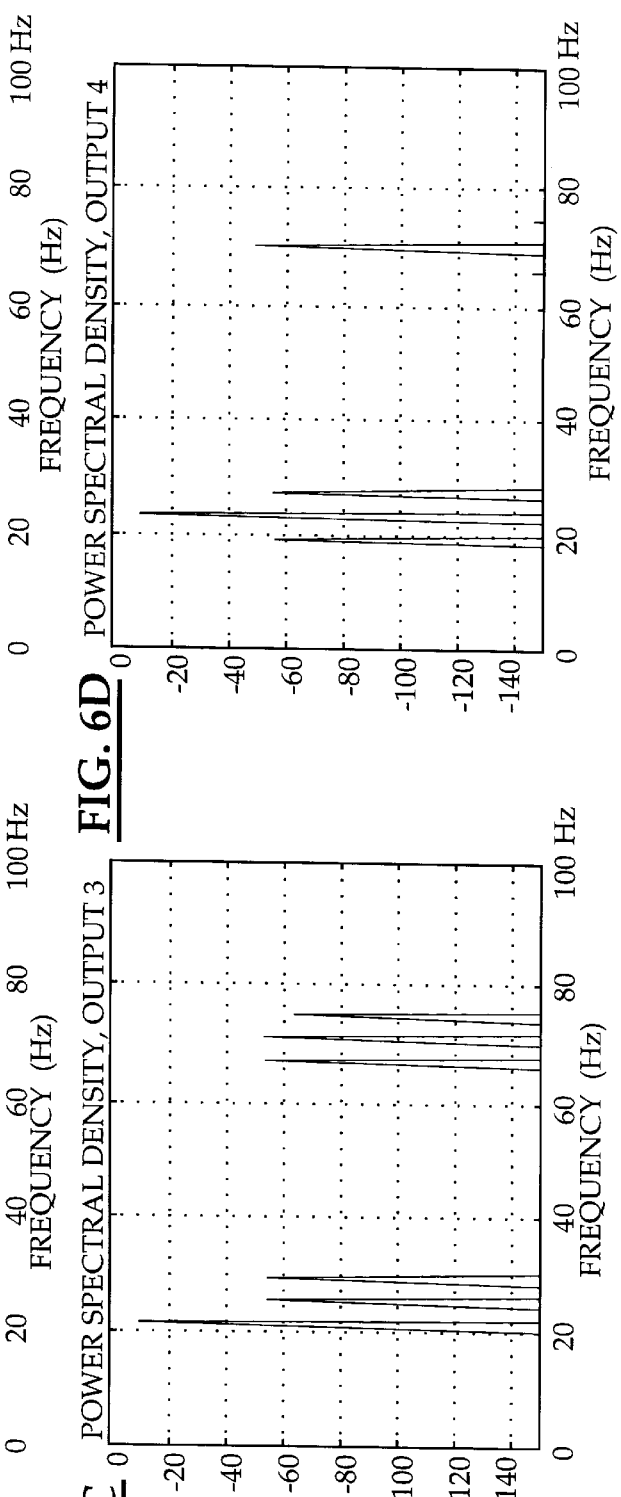

FIG. 5 shows the output of amplifier A with three −9.03 dBW signals to input port nos. 1, 2 and 3. FIGS. 6A, 6C, 6D show the outputs with the desired signals appearing at output port nos. 1, 3 and 4. Note that each of these output ports also has two intermodulation products while FIG. 6B shows that output port 2 has three products, each of which is 6 dB higher.

The 6 dB higher products are the three-signal products of the type $f_c+f_d-f_e$. These have all been steered to the dissipation port no. 2. Meanwhile, the products that do remain with the desired signals are all two signals of the type $2*f_a-f_b$. In comparing this result to running all signals through a single amplifier of 4 times the power capability, the intermodulation power in the first outside frequency has been reduced by 1/(1+4) or 7 dB, the equivalent of increasing the third order intermodulation intercept point of the amplifier by 3.5 dB. In addition, there are now no output port/frequency combinations where there is a sum of intermodulation products. This precludes the possibility of coherent peaking due to two intermodulation products adding in-phase. FIG. 7 summarizes this distribution of IM products through a frequency/port output map for 3 input ports at simulation frequencies of 21, 23 and 25 Hz, that provide desired output signals at about 1 dB. Frequencies of about 25 Hz were used for convenience in simulation since all the same electrical effects will exist here that occur at actual radio frequencies. As shown, in FIG. 7 all the worst intermodulation products at about −43 dB are shunted to output dissipation port 2.

The combination of intermodulation sorting and three channels would suggest applications in sectorized sites where three transmitting amplifiers and associated antennas are being used. The advantages of the 3×4 System in terms of load sharing and improved reliability are even better than that for the 6×8 System, discussed below.

A brief investigation was made of 5th order products with the 3×4 system. Clearly the sorting properties were present. A small sample of runs also showed the strongest products going to the output dissipation port. The number of 5th order products is great enough so that a Monte Carlo run is needed to determine the power levels accurately.

For these reasons, the invention achieves higher reliability and reduced intermodulation distortion.

An M by 5 Power Sharing Amplifier System

The five amplifier network can be realized in discrete Fourier transform form. In such an amplifier, the phase shifts needed are all multiples of 72 degrees. The network can be built from power dividers and phase shifters, in a manner similar to that discussed above. This network has not been analyzed but one skilled in the art should expect intermodulation steering to occur as it did with 2, 3, 4 and 8 input power sharing amplifier networks.

Figure 8:
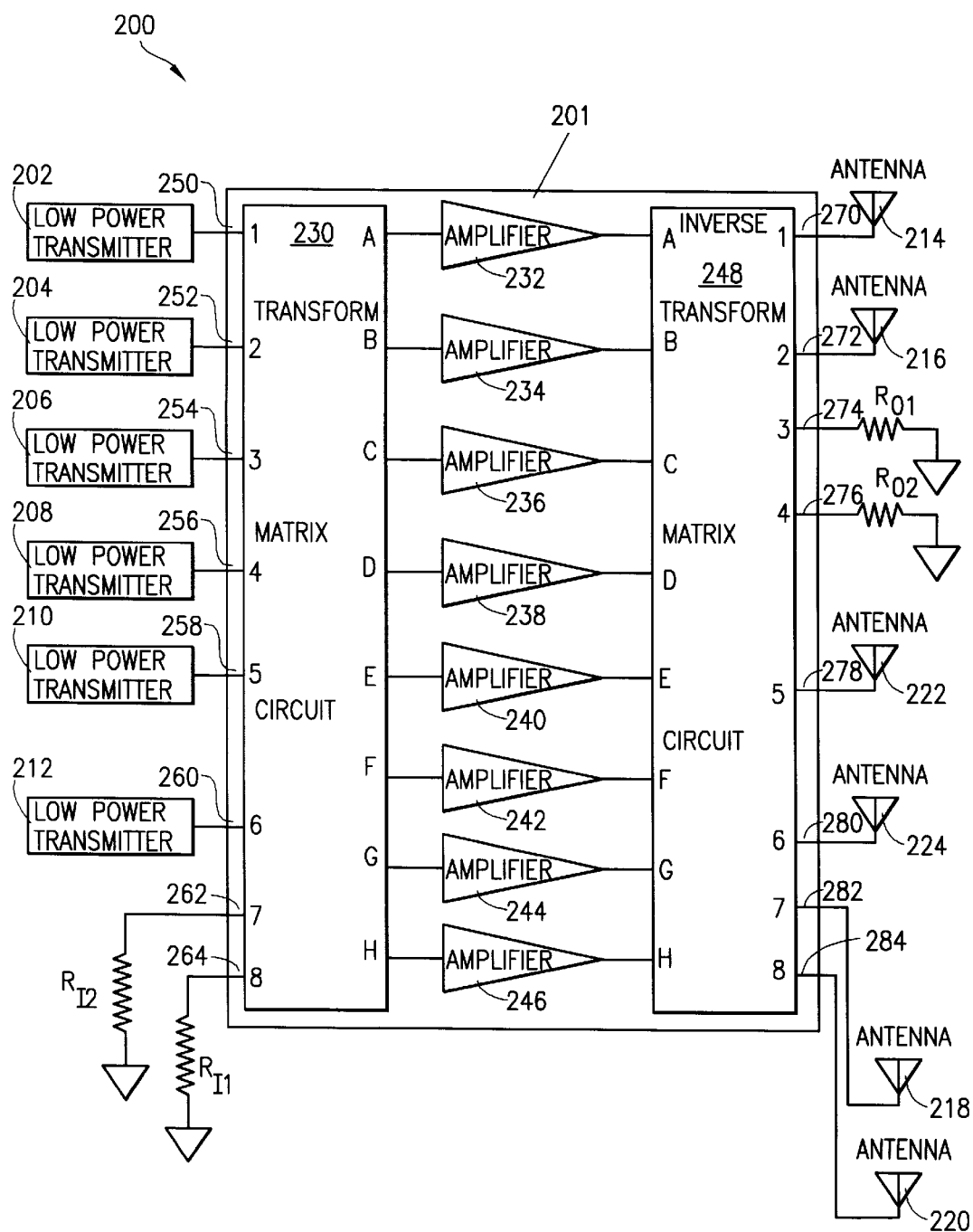
FIG. 8 is a block diagram of a 6 by 8 cellular configuration that is an alternative embodiment of the present invention.

6 by 8 Cellular Configuration in FIG. 8

FIG. 8 shows a 6 by 8 cellular configuration generally indicated as 200 having a power sharing amplifying system 201 coupled between six low power transmitters, 202, 204, 206, 208, 210, 212 and six antennas 214, 216, 218, 220, 222, 224.

The power sharing amplifying system 201 has an 8th order transform matrix circuit 230, eight amplifiers 232, 234, 236, 238, 240, 242, 244, 246, and an inverse 8th order transform matrix circuit 248.

The 8th order transform matrix circuit 230 includes six input port nos. 1–8 labelled 250, 252, 254, 256, 258, 260 that respectively respond to six RF input signals from the six low power transmitters 202, 204, 206, 208, 210, 212. As shown, in the present invention the 8th order transform matrix circuit 230 features two input ports 262, 264 that do not receive RF input signals but instead are each coupled to ground via respective resistors Ri1, Ri2. The 8th order transform matrix circuit 230 includes eight outputs ports A, B, C, D, E, F, G, H, for providing eight transformed RF input signals to the eight amplifiers 232, 234, 236, 238, 240, 242, 244, 246. As shown in FIG. 8, the 8th order transform matrix circuit 230 is an 8 by 8 Fourier transform matrix with phase shifts shown in FIG. 1E.

The eight amplifiers 232, 234, 236, 238, 240, 242, 244, 246 are shared linear power amplifiers that respectively respond to the eight transformed RF input signals, and provide eight shared linear power amplified transformed RF input signals.

The 8th order inverse transform matrix circuit 248 responds to the eight shared linear power amplified transformed RF input signals, for providing six inversely transformed amplified RF output signals from six output port nos. 1–6 labelled 270, 272, 274, 276, 278, 280. The 8th order inverse transform matrix circuit 248 includes two output dissipation port nos. 3 and 4 labelled 274, 276 that do not provide inversely transformed amplified RF output signals, but instead are each coupled to ground via respective resistors Ro1, Ro2 to dissipate the intermodulation products. As shown in FIG. 8, the 8th order inverse transform matrix circuit 248 is an 8th order Fourier inverse transform matrix.

In operation, when the six input signals are available as RF signal ports, the power sharing amplification system 201 can be used to improve system operation by sharing the amplifier power, regardless of the distribution of beam loading, as well as providing the improved reliability associated with any amplifier combining system. Based on simulations and actual experimental measurements discussed in greater detail below, the intermodulation products that occur in the amplifiers with the multiple signals are substantially delivered to the two output dissipation ports, so the intermodulation levels in the signal paths are reduced accordingly.

One important advantage of the power sharing amplification 201 system is that when six beams are available as RF signal input ports, the 6×8 cellular configuration can be used to improve system operation by sharing the amplifier power, regardless of the distribution of beam loading, as well as providing the improved reliability associated with any amplifier combining system. Based on experimental measurements, the intermodulation products that occur in the amplifiers with the multiple signals are substantially provided from the two output dissipation ports, and the intermodulation levels in the signal paths are reduced accordingly.

The power sharing amplification system 201 like that shown in FIG. 8 was verified against C/NL2 (Commercial Computer program from Artech House, Boston Mass.) by conducting computer modelling of a 3 by 4 power sharing amplifier system like that shown in FIG. 3.

An M×8 Power Sharing Amplifier System

The 6×8 system is described above, and the output map in FIG. 9 shows the levels that occur at various frequencies and ports. From this, one could chose a lesser M than 6 to eliminate the higher levels of products. For instance, output ports 3 and 4 both have two −52.2 dB out-of-band products. For most systems, it would be desirable for an M less than 6 to start by removing the inputs associated with these two outputs. Other goals, like reducing intermodulation below the occupied band would come to different conclusions. The intermodulation steering property provides a design tool for optimizing the amplifier splitting network.

General M by N Power Sharing Amplifier Systems

The following is a brief discussion of Nth order transform networks which would be generally understood by a person skilled in the art as it relates to the embodiments described above.

The general characteristic of suitable input or output networks for the 3 by 4 and 6 by 8 systems are:

(1) Approximately equal amplitudes to equalize the loading of the amplifiers, or unequal amplitudes if the amplifiers for some reason were chosen to be of different sizes.

(2) Multiples of 90 degree phase shift differences to provide steering of signals and intermodulation products.

(3) Other networks that are simple rearrangements of rows and columns of the network transform matrix of the above.

(4) Other networks that are the result of adding phase shifts to either the input or output ports.

One of the networks that meets the above requirements consists of a discrete Fourier transform for the input and output networks, with one reversed from the other. This is generally referred to as a Fourier transform and an inverse Fourier transform. Usual definitions of the Fourier transform distinguish the inverse transform by the sign of the phase progression and by the presence of a scaling factor 1/N in the inverse. (See Brigham, E. O. "The Fast Fourier Transform," Prentice-Hall 1974, pages 91–99.) The phase progression being + or − only renumbers the ports and is not important. The 1/N factor, however, defines a network that is lossy whereas the network without prescaling requires gain and is therefore not passive. For the lossless passive case, both the Fourier transform and the inverse Fourier transform must have a factor 1/(square root(N)). All discussions herein assume this scaling factor is present in the network equations.

The implementations used the parallels between the "Fast-Fourier Transfer Butterfly" and the physical implementation in a quadrature hybrid. This is a suitable analog for those cases where the basic fast-Fourier transfer can be used, i.e., where N is a power of 2.

Consistent with that discussed above, the general discrete Fourier transform can be used to build an amplifier system with signal and intermodulation steering for any value of N, usable for constructing M by N power sharing amplifier systems. This produces physical networks consisting of N-way power dividers and a phase shifter on the output port of each divider. The phase shifts are integer multiples of 360/N degrees. For each of the input and output networks, these power divider/phase shifter patterns are repeated N times. An example for N=3 is shown in FIG. 2B above.

The total number of N-way dividers required is 4*N. This makes large values of N rather complex. Additionally, the number of different third-order intermodulation products grows at the general rate of $N^2$ whereas the number of ports is N. Thus the gains of steering products drops off with increasing N since one approaches the case that there are "products everywhere". Probably the most interesting cases are N=2, 3, 4, 5 and 8, as discussed above. N=2 is the standard quadrature-coupled balanced amplifier and if used with two inputs will steer one of the two third order intermodulation products to each of the two output ports, along with a signal.

In general, it is possible to extend the M by N amplifier system to have either more or less outputs than inputs. In its simplest form this would consist, for example, of a power combiner on the output to allow multiple outputs to be applied to a single antenna.

Figure 10A:
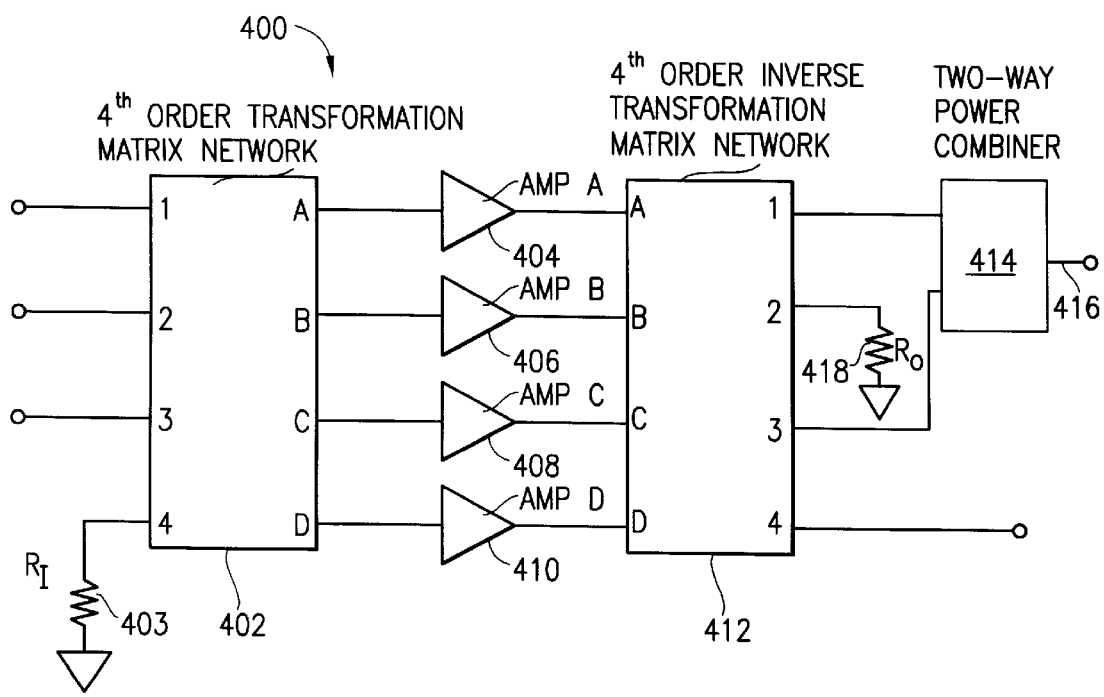
FIG. 10A and 10B show schematic diagrams of another embodiment of the present invention.

FIG. 10A shows a 3 by 4 power sharing amplifier system generally indicated as 400 having input three signals for feeding into two output signals to the antenna (not shown). In FIG. 10A, the power sharing amplifier system 400 has a 4th order transformation matrix network 402, four amplifiers 404, 406, 408, 410, a 4th order transformation matrix network 412, and a two-way power combiner 414. The 4th order transformation matrix network 402 receives the three input signals into input ports labelled 1, 2, and 3. The input port labelled 4 is connected to ground by a matching resistor 403. As shown, the 4th order inverse transformation matrix network 412 provides two output signals from output ports labelled 1 and 3 to the two-way power combiner 414. The 4th order transformation matrix network 412 provides one output signal from an output port labelled 4 to the antenna (not shown). The two-way power combiner 414 provide another output signal from a port 416 to the antenna (not shown). The output port labelled 2 is connected to ground by a matching resistor $R_o$, labelled 418.

Figure 10B:
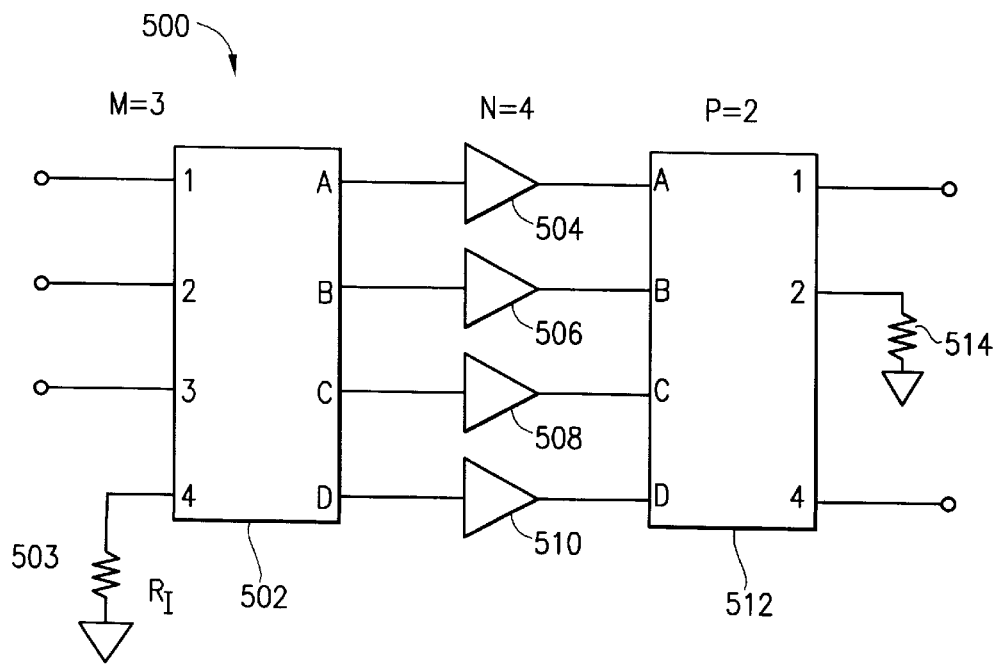

FIG. 10B shows an M by N by P power sharing amplifier system generally indicated as 500 that is the result of the two output network being combined in FIG. 10A, for M=3, N=4 and P=2. As shown, the M by N by P power sharing amplifier system 500 has a 4th order transformation matrix network 502, four amplifiers 504, 506, 508, 510, and a combined 4th order transformation matrix and power combiner network 512. The 4th order transformation matrix network 502 receives the three input signals into input ports labelled 1, 2, and 3. The input port labelled 4 is connected to ground by a matching resistor $R_p$, labelled 503. As shown, the combined 4th order transformation matrix and power combiner network 512 provides two output signals from output ports labelled 1' and 4 to an antenna (not shown). The output port labelled 2 is connected to ground by a matching resistor 514.

How the Invention Works

The ability of two-signal, two non-linear device systems to sort out conversion products has been used for many years as the phasing system of single-sideband generation. See Norgaard, D. E., "The Phase Shift Method of Single Sideband Generation", Proc. IRE, pp 1718–1735, December 1956. This system uses a combination of 90 degree phase shift networks to select second-order mixing products of two signals. The ability of similar networks to do this same selection for third-order products is demonstrated in the following analysis.

A non-linear amplifier is described by a power series using the equation:

$$e_o = c_1 * e_i + c_3 * e_i^3.$$

The power series is driven with the sum of two sine waves using the equations:

$$e_i = a_1 * \cos(w_1 * t + p_1) + a_2 * \cos(w_2 * t + p_2).$$

Then the well known result for third-order intermodulation can be modified to show the relative phase shift relationship between the input signals and the two-signal intermodulation products. After the terms have been multiplied out and separated by frequency component, the $2*w_1-w_2$ product is found to be determined by:

$$(3*c_3*a_1^2*a_2/4)*\cos(2*w_1*t - w_2*t + 2*p_1 - p_2).$$

Likewise, the $2*w_2-w_1$ product is determined by:

$$(3*c_3*a_1*a_2^2/4)*\cos(2*w_2*t - w_1*t + 2*p_2 - p_1).$$

The amplitude coefficients, of course, are the same as those from the traditional intercept point analysis. The phase shifts follow the input phase shift in a simple pattern; the multipliers are the same as those describing the product. As summarized in the following table:

| Signal Frequency | Signal Type | Phase Shift |
|---|---|---|
| $W_1$ | Desired Signal | $P_1$ |
| $W_2$ | Desired Signal | $P_2$ |
| $2W_1-W_2$ | 3rd Order IM | $2p_1-p_2$ |
| $2W_2-W_1$ | 3rd Order IM | $2p_2-p_1$ |

The significant item is that for multiple signal paths, the phase shift of the signals and the various intermodulation products is not the same. This allows various products to add or cancel in the output network. By choosing the path lengths correctly, one can "steer" some or all of the intermodulation products into an output port that goes to a resistive termination.

It should be obvious that this steering ability of the phase-shift network can be extended to larger networks. As the network grows the number of degrees of freedom gets proportionally larger allowing more signals and products to be steered as desired. It might also be noted that the number of products is growing much faster than the network degrees of freedom, however, so for large networks there are many products that will be forced to arbitrary output ports.

General Discussion of Modelling and Experimentation of a Power Sharing Amplifier System of the Present Invention In general, the power sharing amplifier system of the present invention uses Fourier Transform matrices, discussed above, and is a lossless network, meaning that no intentional loss, such as loads or balancing resistors are used. The particular choice of one of many 90 degree phase shifts gives the property of single paths. The lossless characteristic allows simple modelling as voltage addition, and for this reason an analysis was done by the inventor using the Matlab™ simulation program (The Mathworks, Natick, Mass.). The following specifically describes the simulation of a 6 by 8 amplifier system.

Signals were generated as six cosine waves, all of the same amplitude but of random phase. The random phase was distributed uniformly on (0, 2*pi). The frequencies 21, 23, 25, 27, 29 and 31 Hz were chosen in the simulation to avoid spectral smearing. Frequencies around 25 Hz were chosen as a convenience for modelling. Radio systems, of course, would use much higher frequencies, such as 900 MHz. Nothing in the invention is sensitive to the particular choice of frequencies.

In-phase components are $$si_j = a_1 * \cos(ph_j + kf_j * t) \text{ for } j=1 \text{ to } 6,$$

where a1=maximum sine wave amplitude $kf_j = 2*pi*(21.0+2*j)$ $ph_j = pi2*rand(0, 2*pi)$ Six quadrature signals are then formed by use of a Hilbert transform, selected to provide a maximum relative amplitude error in the order of $10^{-5}$.

$$sq_j = Hil(si_j)$$

Amplifiers are designated by letters a to h and their inputs are defined by an input matrix using the equations:

$$sia=sqr(1/8)*(si_1+si_2+si_3+si_4+si_5+si_6)$$

$$sib=sqr(1/8)*(sq_1+sq_2+sq_3+sq_4-sq_5-sq_6)$$

$$sic=sqr(1/8)*(sq_1+sq_2-sq_3-sq_4-sq_5-sq_6)$$

$$sid=sqr(1/8)*(-si_1-si_2+si_3+si_4-si_5-si_6)$$

$$sie=sqr(1/8)*(-si_1+si_2+si_3-si_4+si_5-si_6)$$

$$sif=sqr(1/8)*(-sq_1+sq_2+sq_3-sq_4-sq_5+sq_6)$$

$$sig=sqr(1/8)*(sq_1-sq_2+sq_3-sq_4+sq_5-sq_6)$$

$$sih=sqr(1/8)*(-si_1+si_2-si_3+si_4+si_5-si_6)$$

The amplifiers are linear plus cubic term, memoryless devices, characterized by the coefficients c1 and c3. The third order intercept point (IP) for the amplifier, IP3, assuming a 1 Ohm system, is determined by the equation:

$$IP3=10.0*\log 10(-2*c1^3/3*c3);$$

For this study the following coefficient were assumed:

$$c1=1.0$$

$$c3=-0.1,$$

producing a third-order intercept point of 8.24 dBW.

Amplifier outputs, soia to soih, are thus determined by the equations:

$$soia=c1*sia+c3*sia^3$$

$$\ldots$$

$$soih=c1*sih+c3*sih^3$$

The quadrature versions of the amplifier output signals, soqa to soqh, are then created, where needed, with the Hilbert transform. The in-phase and quadrature signals are added to create the 8 outputs determined by the equations that represent the 8th order transform matrix:

$$so_1=sqr(1/8)*(soia+soqb+soqc-soid-soie-soqf+soqg-soih)$$

$$so_2=sqr(1/8)*(soia+soqb+soqc-soid+soie+soqf-soqg+soih)$$

$$so_3=sqr(1/8)*(soia+soqb-soqc+soid+soie+soqf+soqg-soih)$$

$$so_4=sqr(1/8)*(soia+soqb-soqc-soid-soie-soqf-soqg+soih)$$

$$so_5=sqr(1/8)*(soia-soqb-soqc-soid+soie-soqf+soqg+soih)$$

$$so_6=sqr(1/8)*(soia-soqb-soqc-soid-soie+soqf-soqg-soih)$$

$$so_7=sqr(1/8)*(soia-soqb+soqc+soid+soie+soqf+soqg+soih)$$

$$so_8=sqr(1/8)*(soia-soqb+soqc+soid+soie-soqf-soqg-soih)$$

In the simulation, these eight outputs are examined with a Fast Fourier Transform (FFT) to determine the power in each signal and intermodulation component. Some outputs have multiple intermodulation signals at a single frequency. Because of this, it is necessary to run multiple simulations and take the average power at each frequency.

FIG. 9 shows a frequency/output-channel map for a simulation for a system with 0.5 Volts peak or −9.03 dBW in a 1 Ohm system. The 6 chosen input signals are at frequencies 21, 23, 25, 27, 29 and 31 Hz. Signals lower than 21 Hz and greater than 31 Hz are considered out-of-band. As shown in FIG. 8, over half of the 128 possible map locations are zero in a "checkerboard" pattern. Other locations have outputs corresponding to specific intermodulation products, or in some cases, sums of intermodulation products. These break down according to average power, as follows:

- −61.6 dBW Two-signal 3rd order product, $2*f_a-f_b$
- −55.6 dBW Three-signal 3rd order product, $f_c+f_d-f_e$
- −54.8 dBW Two-signal 3rd order product, $2*f_a-f_b$, plus one three-signal product, $f_c+f_d-f_e$
- −52.2 dBW Two three-signal 3rd order products
- −9.3 dBW Desired signal, with compression.

(See Larkin, R. S., "Multiple-Signal Intermodulation and Stability Considerations in the Use of Linear Repeaters", IEEE Vehicular Technology Conference, 1991, for a description of the product types and their relative amplitudes).

The numbers differ from the simple power law model by a few tenths of a dB due to both gain compression and to the finite sample of the sums of two random-phase sine waves. As shown, each intermodulation product is directed to one, and only one of the eight output ports. The particular port for each output is not tied to the relative phases of the inputs.

In order to interpret the results a reference case is used. One way is to compare the IM level against the level that would be seen if all six signals were passing through an amplifier with an intercept point eight times that of a single amplifier. In this case the worst case, or first outside channel, has a power enhancement relative to the intermodulation produced by two signals of:

$$n2-3n/2=36-3*6/2=27 \text{ or } 14.3 \text{ dB}.$$

See Larkin, R. S., "Multiple-Signal Intermodulation and Stability Considerations in the Use of Linear Repeaters", VTC, 1991. This would produce a level of −61.6+−14.3= 47.3 dBW. With gain compression this level would be a few tenths lower, perhaps −47.8 dBW. The worst case output is −52.2 dBW and so the improvement is 4.4 dB, or the equivalent to an increase in intercept point of 2.2 dB over the single x8 amplifier.

It is interesting to note that every one of the outputs has a double three-signal product at some frequency. Some of them, though, are in-band and could for some applications, be considered less harmful. Thus, outputs 1, 6 and 8 corresponding to inputs 6, 1 and 3 have out-of-band IM about 2.5 dB lower then the other outputs.

Also, the total intermodulation power is the same as for the single eight times more powerful amplifier, if one adds up all 8 outputs. This was checked in detail for the first outside frequencies, where the results are easily calculated. Allowing for gain compression, it is seen that all power is accounted for.

Verification

The simulation results were verified in two ways.

Figure 11A:
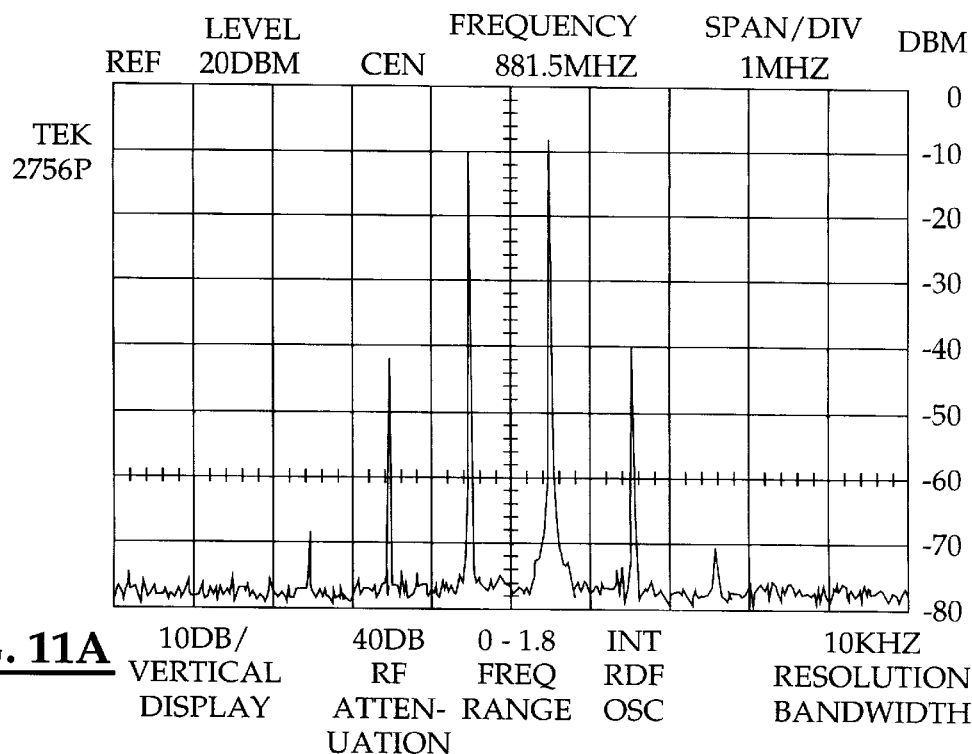
FIGS. 11A and 11B are plots of measurements of actual amplifier output signals from two amplifiers in an experimental 2 by 8 cellular configuration similar to the 6 by 8 cellular configuration shown in FIG. 8.
Figure 11B:
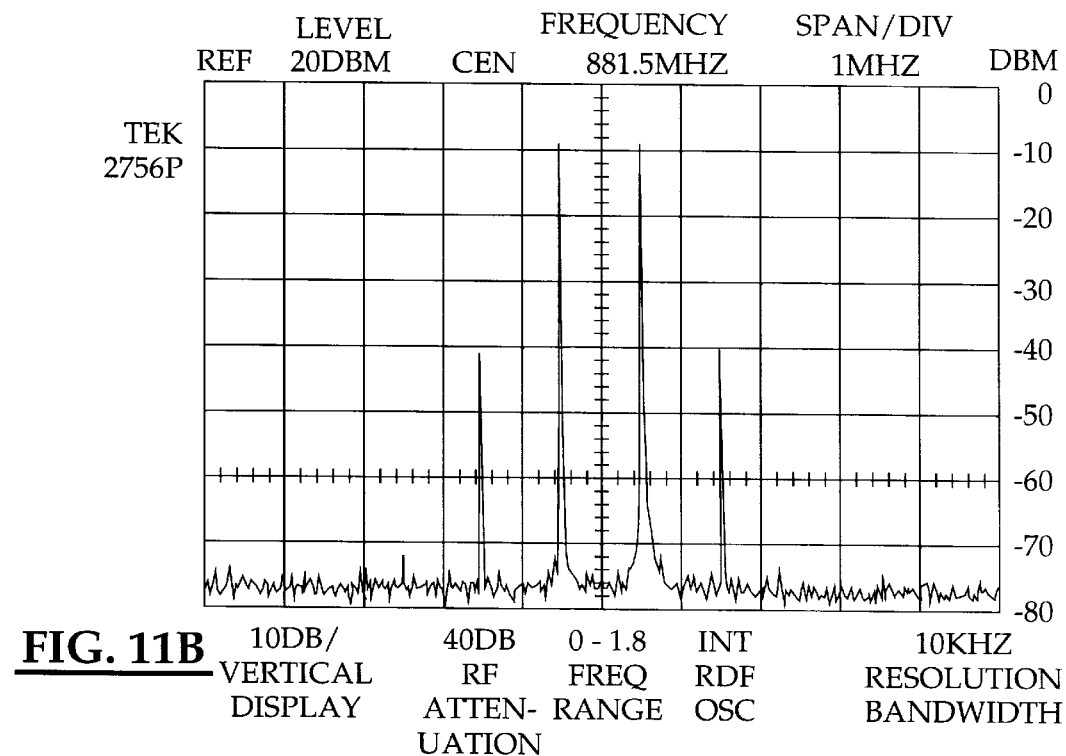
Figure 12A:
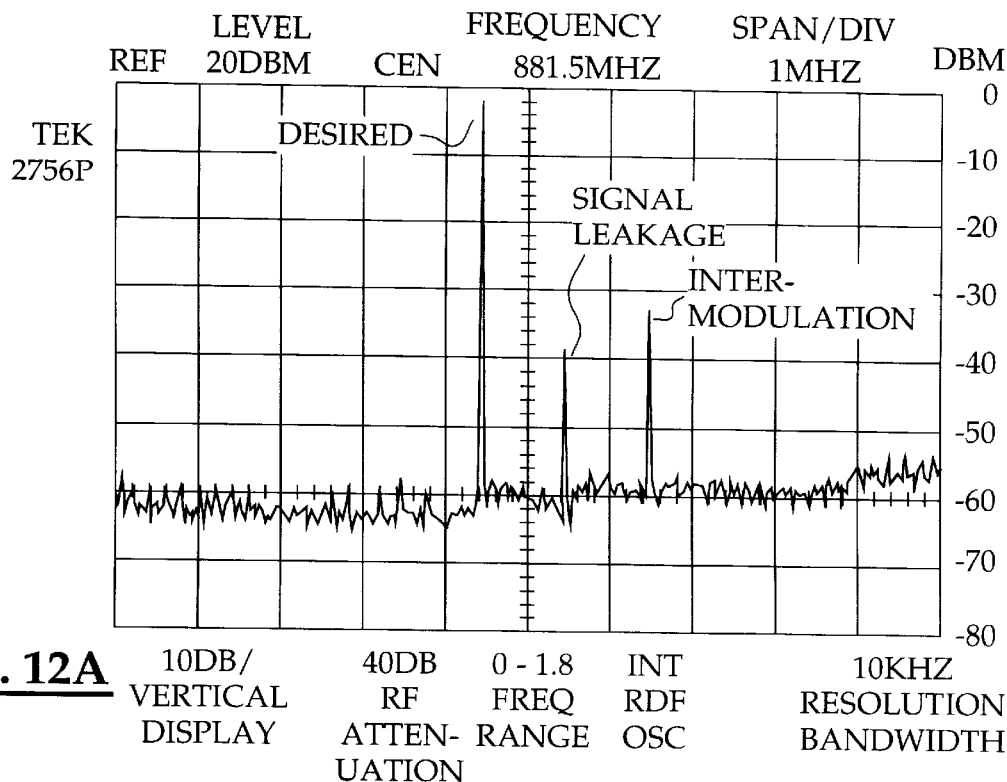
FIGS. 12A and 12B are graphs of measurements of two actual output signals in the experimental 2 by 8 cellular configuration similar to the 6 by 8 cellular configuration shown in FIG. 8.
Figure 12B:
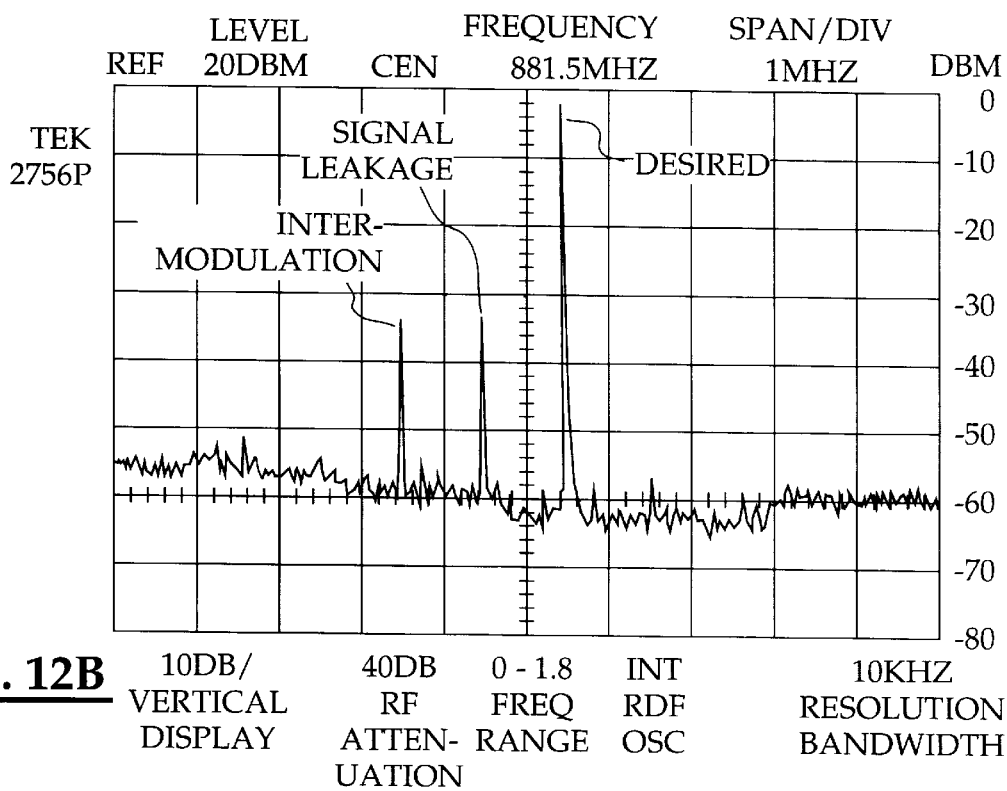
Figure 13A:
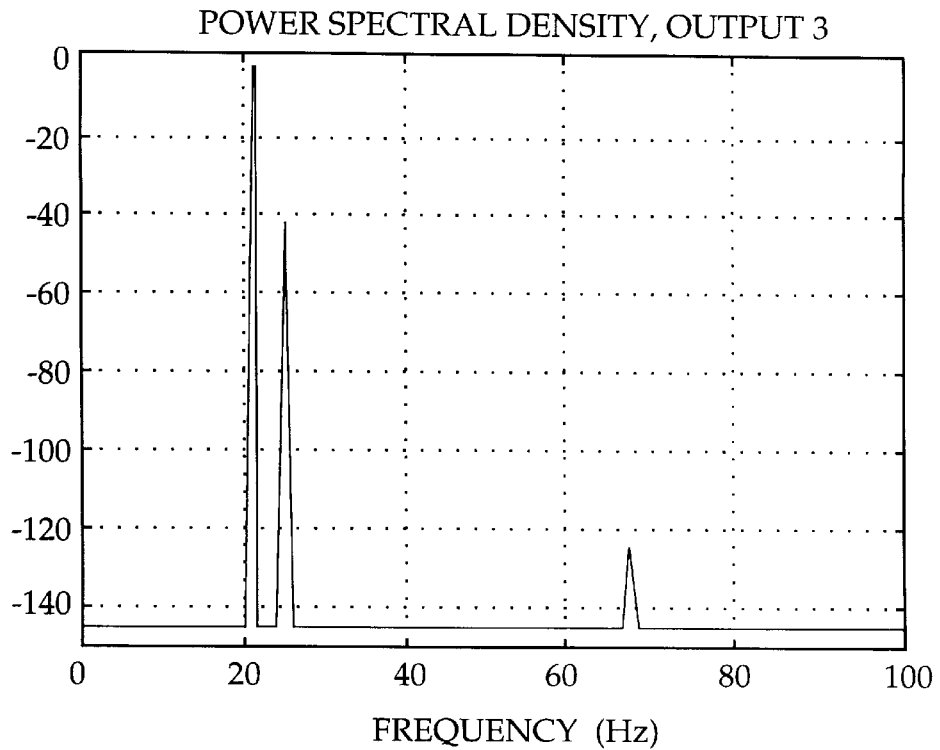
FIGS. 13A and 13B are graphs of simulations of the two outputs for the experimental 2 by 8 cellular configuration of FIGS. 12A and 12B.
Figure 13B:
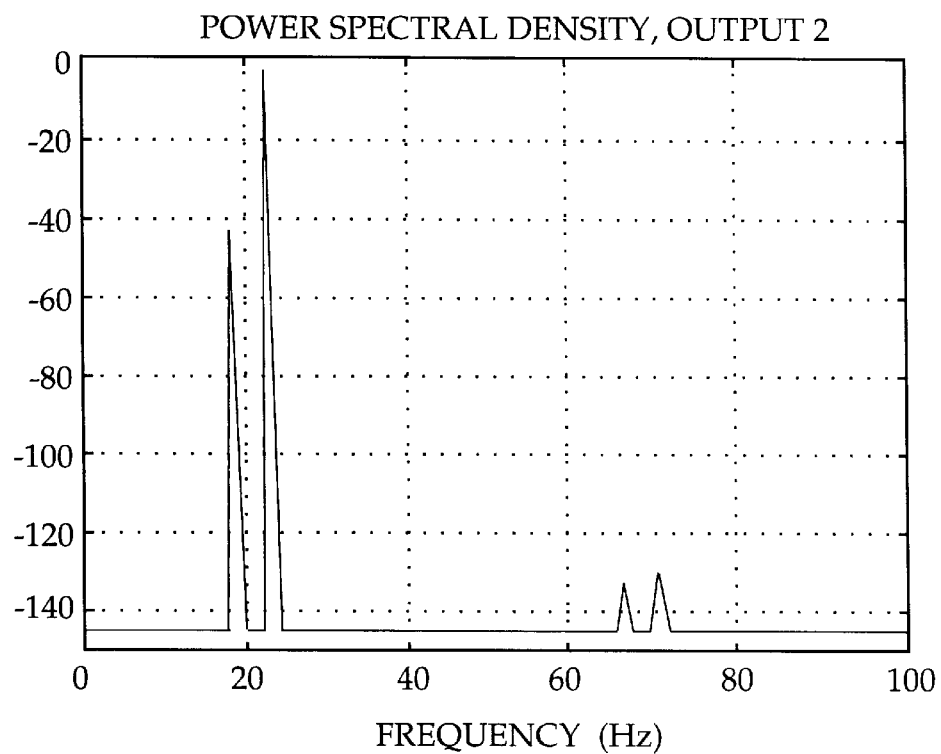

As a first verification, two-signal measurements were made on a 2 by 8 power sharing amplifier system similar to that of FIG. 8. Signals were placed into inputs 5 and 8 and outputs 2 and 3 were observed. All other input and output ports were terminated. FIGS. 11A and 11B show measurements of two typical amplifier outputs showing even distribution of power and intermodulation. In FIGS. 11A and 11B, the desired input signals have output signals at about −9 dB, while third order intermodulation products are shown at about −21 dB or about 32 dB below the desired output signal. The output distributions for the other six amplifiers are substantially similar. The Matlab™ simulation predicted the lower intermodulation (IM) product to appear in output 2 and the upper intermodulation product in output 3. FIGS. 12A and 12B show measured data according to the Matlab simulation in FIGS. 13A and 13B. The suppression of the intermodulation products is the same 32 dB as that of the amplifiers (see FIGS. 11A and 11B), but the intermodulation products have indeed been sorted out by output ports. The extra signals seen in the measured data are from the other inputs leaking into the wrong output due to the finite balance of the matrices. All signal levels in FIGS. 12A and 12B are about 9 dB higher than those of FIGS. 11A and 11B because of the combing action of the 8th order transformation matrix circuit.

As a second verification, a C/NL2 Volterra series simulation was used. See Maas, Stephen, "C/NL2—Linear and Nonlinear Microwave Circuit Analysis and Optimization", Artech House, Boston, Mass. This program can only handle 3 inputs and so the study was reduced to 3 signals and 4 amplifiers. The agreement between the Matlab™ simulation results and those from C/NL2 was limited only by the slight gain compression that is shown in the Matlab results but not for C/NL2.

Range of Possible Networks

Mathematically, it is possible to select an arbitrary input network to split the input signals to the multiple amplifiers and then, if the inverse of this network transfer matrix exists, to construct the proper network for steering signals to single ports by using the inverse of the transfer matrix to describe the output network. That is, the input transfer matrix times its inverse is the unit matrix. Several problems remain. The inverse may not be realizable and/or it may not be passive. Further, it will generally not have useful behavior relative to intermodulation performance.

All of the N-way Transform Matrices described above have the characteristic that they can be used on the output by reversing the ports. That is, equivalent to taking the transpose of the transfer matrix and requires that the transfer matrix be square. If A is the transfer matrix that describes the voltage at N amplifiers, vector $E_A$, in terms of the N input voltage vector $E_1$, where $$E_A = AE_1,$$

then the networks used are a solution of $$AA^T = U$$

or equivalently $$A^T = A^{-1}$$

The input matrix can be constrained to place equal signals at each amplifier and to be possible. This sets the form of a matrix such as:

$$A = \begin{bmatrix} e_j^{p11} & e^{jp12} & \cdots & e^{jp1n} \\ e^{jp21} & e^{jp22} & \cdots & e^{jp2n} \\ & & \cdots & \\ e^{jpn1} & e^{j'pn2} & \cdots & e^{jpnn} \end{bmatrix}$$

where pij is the phase shift for input i and output j. This ends up with $AA^T = U$ producing a group of transcendental equations that could be solved. Unfortunately, there still are other networks with useful steering properties that do not meet the transpose requirement. This is easily seen by observing that adding phase shift to the output ports of the output network does not change any of the signal steering or intermodulation characteristics, other than their phase.

Furthermore, there are a whole series of other networks that are merely shifts in the rows and columns of the known solution. These are simply renumbering of coax connectors rather than truly alternate solutions.

Scope of the Invention

Although the present invention has been described and discussed herein with respect to embodiments, other arrangements or configurations may also be used that do not depart from the spirit and scope of the invention.

What is claimed is:

1. A power sharing amplifier system comprising:
   an N×N transform matrix circuit having M input ports that respond to M input signals and provide N transformed input signals, the N×N transform matrix circuit having at least two input ports that do not receive an input signal;
   N amplifiers that respond to the N transformed input signals and provide N amplified transformed signals; and
   an N×N inverse transform matrix circuit that responds to the N amplified transformed signals and provides M inverse transform amplified output signals to M output ports, the N×N inverse transform matrix circuit having at least two output dissipation ports that do not provide an output signal to an antenna but instead provide an output for dissipation of intermodulation products;
   wherein M and N are integers greater than 2 respectively, and where M is less than N;
   wherein M is not equal to 6; and
   wherein N is not equal to 8.

2. A power sharing amplifier system according to claim 1, wherein each of the at least two output dissipation port for dissipating the intermodulation products are coupled to ground via a respective resistor.

3. A power sharing amplifier system according to claim 1, wherein each of the at least two input ports is coupled to ground via a respective resistor.

4. A power sharing amplifier system according to claim 1,
   wherein the at least two output dissipation ports is coupled to ground via a matching resistor; and
   wherein the at least two input ports are coupled to ground via another respective matching resistor.

5. A power sharing amplifier system according to claim 1, wherein the intermodulation products include three-signal third order intermodulation products.

6. A power sharing amplifier system according to claim 1,
   wherein the N×N transform matrix circuit is an N by N Fourier transform matrix circuit; and
   wherein the N×N inverse transform matrix circuit is an N by N inverse Fourier transform matrix circuit.

7. A power sharing amplifier system according to claim 1, wherein the N amplifiers are power amplifiers.

8. A power sharing amplifier system according to claim 1,
   wherein the N×N transform matrix circuit includes two input ports that each respond to a respective input signal, includes an input port that is coupled to ground via a resistor, and includes three outputs ports for providing three transformed input signals; and
   wherein the N amplifiers include three shared linear power amplifiers that respectively respond to the three transformed input signals and provide three shared linear power amplified transformed signals; and wherein the N×N inverse transform matrix circuit includes three input ports that respectively respond to the three shared linear power amplified transformed signals, includes two outputs ports for providing two inversely transformed amplified output signals, and includes an output dissipation port that does not provide an output signal but instead is coupled to ground via a resistor to dissipate the intermodulation products.

9. A power sharing amplifier system according to claim 8, wherein the respective input signal has a constant envelope.

10. A power sharing amplifier system according to claim 9, wherein one input signal is a summed signal; and wherein another signal is a different signal than the summed signal.

11. A power sharing amplifier system according to claim 10, wherein the summed signal is the sum of two sine waves.

12. A power sharing amplifier system according to claim 10, wherein the summed signal has a non-constant envelope.

13. A power sharing amplifier system according to claim 1, wherein the N×N transform matrix circuit includes three input ports that respectively respond to RF input signals, includes an input port that is coupled to ground via a resistor, and includes four outputs ports for providing four transformed RF input signals; and wherein the N amplifiers include four shared linear power amplifiers that respectively respond to the four trans-formed input signals and provide four shared linear power amplified transformed signals; and wherein the N×N inverse transform matrix circuit includes four input ports that respectively respond to the four shared linear power amplified transformed signals, includes three outputs ports for providing three inversely transformed amplified RF output signals, and includes an output dissipation port that does not provide an RF output signal but instead is coupled to ground via a resistor to dissipate the intermodulation products.

14. A power sharing amplifier system according to claim 1, wherein the power sharing amplifier system further comprises a two-way power combiner that responds to at least two of the M inverse transform amplified output signals, for providing a two-way power combiner signal.

15. A power sharing amplifier system according to claim 1, wherein the N×N inverse transform matrix circuit includes a power combiner so as to form a combined 4th order transformation matrix and power combiner network.

16. A power sharing amplifier system according to claim 1, wherein the M input signals comprise signals having complex waveforms, such as AM, FM, digital signals like Time Division Multiple Access (TDMA) and Code Division Multiple Access (CDMA) signals, or the sum of two or more of the signals having complex waveforms.

17. A power sharing amplifier system according to claim 1, wherein the M input signals comprise at least one carrier signal.

* * * * *